United States Patent
Shirakawa et al.

(10) Patent No.: US 10,186,574 B2
(45) Date of Patent: Jan. 22, 2019

(54) SUPER JUNCTION MOSFET DEVICE AND SEMICONDUCTOR CHIP

(71) Applicant: FUJI ELECTRIC CO., LTD., Kanagawa (JP)

(72) Inventors: Tohru Shirakawa, Matsumoto (JP); Tatsuya Naito, Matsumoto (JP); Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/247,933

(22) Filed: Aug. 26, 2016

(65) Prior Publication Data

US 2017/0125515 A1  May 4, 2017

(30) Foreign Application Priority Data

Oct. 29, 2015 (JP) .................................. 2015-212909

(51) Int. Cl.
| | |
|---|---|
| *H01L 29/06* | (2006.01) |
| *H01L 29/78* | (2006.01) |
| *H01L 29/40* | (2006.01) |
| *H01L 29/08* | (2006.01) |

(52) U.S. Cl.
CPC ........ *H01L 29/0634* (2013.01); *H01L 29/086* (2013.01); *H01L 29/0869* (2013.01); *H01L 29/407* (2013.01); *H01L 29/7802* (2013.01); *H01L 29/7805* (2013.01); *H01L 29/7811* (2013.01); *H01L 29/7813* (2013.01); *H01L 29/0878* (2013.01)

(58) Field of Classification Search
CPC .......................... H01L 29/7802–29/7815; H01L 29/7827–29/7828; H01L 1151/057; H01L 21/823885; H01L 29/0696; H01L 29/1095; H01L 29/66325; H01L 29/7393–29/7395; H01L 29/7397; H01L 2924/13055
See application file for complete search history.

(56) References Cited

U.S. PATENT DOCUMENTS

2002/0027237 A1* 3/2002 Onishi ................ H01L 29/0634
257/262
2014/0203356 A1  7/2014 Kagata et al.
(Continued)

FOREIGN PATENT DOCUMENTS

JP  2010-109033 A  5/2010

*Primary Examiner* — Cuong B Nguyen

(57) ABSTRACT

A super junction MOSFET device including a semiconductor substrate; a base region provided on a primary surface side of the semiconductor substrate and having impurities of a first conductivity type; a source region that includes a portion of a frontmost surface of the base region and has impurities of a second conductivity type; a gate electrode that penetrates through the base region; a source electrode that is provided on the base region and is electrically connected to the source region; and a front surface region that is provided on an entirety of the frontmost surface of the base region in a region differing from a region where the source region and the gate electrode are provided in the base region, is electrically connected to the source electrode provided on the base region, and has a lower impurity concentration of impurities of the second conductivity type than the source region.

9 Claims, 26 Drawing Sheets

(56) References Cited

U.S. PATENT DOCUMENTS

2016/0056810 A1* 2/2016 Kouno ............... H03K 17/0828
    327/432
2016/0172453 A1* 6/2016 Hirabayashi ........ H01L 29/0623
    257/144

* cited by examiner

SUPER JUNCTION MOSFET DEVICE AND SEMICONDUCTOR CHIP

The contents of the following Japanese patent application are incorporated herein by reference:
NO. 2015-212909 filed in JP on Oct. 29, 2015.

BACKGROUND

1. Technical Field

The present invention relates to a super junction MOSFET device and a semiconductor chip.

2. Related Art

Conventionally, in a super junction (abbreviated as SJ) MOSFET, an n+-type impurity region is provided as a source region near a gate electrode, as shown in Patent Document 1, for example. Furthermore, in a conventional SJ MOSFET, an n-type source region is provided over the entire upper portion of a p-type channel region, as shown in Patent Document 2, for example.

Patent Document 1: Japanese Patent Application Publication No. 2013-084905

Patent Document 2: Japanese Patent Application Publication No. 2010-109033

In order to prevent breakdown of an SJ MOSFET device during reverse recovery, there are cases where a free wheeling diode (abbreviated FWD) is connected in parallel with the SJ MOSFET device. In such a case, in order for a surge current to flow through the FWD when the SJ MOSFET device is OFF, it is necessary for the forward voltage (abbreviated Vf) of the body diode of the SJ MOSFET device to be raised above Vf of the FWD. For example, defects are introduced by irradiating a p-type column of the SJ MOSFET device with an electron beam, thereby enabling an increase in Vf of the body diode. However, in this case, due to the introduction of the defects, there is a problem that the leak current from the SJ MOSFET device increases by 20 times to 40 times more than in a case where irradiation with the electron beam is not performed.

SUMMARY

According to a first aspect of the present invention, provided is a super junction MOSFET device comprising a semiconductor substrate, a base region, a source region, a source electrode, a gate electrode, and a front surface region. The base region may be provided on a primary surface side of the semiconductor substrate and have impurities of a first conductivity type. The source region may include a portion of a frontmost surface of the base region and have impurities of a second conductivity type. The gate electrode may penetrate through the base region. The source electrode may be provided on the base region and be electrically connected to the source region. The front surface region may be provided on an entirety of the frontmost surface of the base region in a region differing from a region where the source region and the gate electrode are provided in the base region, be electrically connected to the source electrode provided on the base region, and have a lower impurity concentration of impurities of the second conductivity type than the source region.

The front surface region may have a thickness that is less than a thickness of the source region.

A ratio of the impurity concentration of impurities of the second conductivity type of the front surface region to an impurity concentration of impurities of the first conductivity type of the base region may be greater than or equal to 1 and less than or equal to 1,000.

The semiconductor substrate may include first columns having impurities of the first conductivity type and second columns having impurities of the second conductivity type arranged periodically and in an alternating manner below the base region. The gate electrode may extend from the frontmost surface of the base region and reaches the second columns. The super junction MOSFET device may further comprise separation trenches. The separation trenches may each extend downward from a portion of the front surface region to a boundary between a second column and a first column adjacent to the second column. The separation trenches may each spatially separate the base region near the gate electrode from the first column.

An upper portion of each second column may have a protruding portion that protrudes toward the first column side at the boundary between the first column and the second column. A portion of each separation trench may be positioned at a protruding portion.

The gate electrode may be a trench gate electrode that extends from the frontmost surface of the base region and reaches the second columns. Depth of each separation trench may be greater than depth of the trench gate electrode.

Each separation trench may include an insulating film and a trench electrode that is provided in contact with the insulating film. The trench electrode may be electrically connected to the gate electrode.

Each separation trench may include an insulating film and a trench electrode that is provided in contact with the insulating film. The trench electrode may be electrically connected to the source electrode.

In a cross section obtained by cleaving the semiconductor substrate along a plane orthogonal to the primary surface, when a distance from a center of the gate electrode to an end of the source region in a first direction is $W_{ns2}$, a distance from the center of the gate electrode to an end of the separation trench in a direction opposite the first direction is $W_{dt}$, and a distance from the center of the gate electrode to the boundary between the first column and the second column is $W_{pk}$, the expression $W_{ns2} < W_{dt} \leq W_{pk}$ may be satisfied.

According to a second aspect of the present invention, provided is a super junction MOSFET device comprising a semiconductor substrate, a base region, a source region, a source electrode, a gate electrode, and a front surface region. The base region may be provided on a primary surface side of the semiconductor substrate and have impurities of a first conductivity type. The source region may include a portion of a frontmost surface of the base region and have impurities of a second conductivity type. The gate electrode may be provided on the base region in a manner to cover a partial region of the base region adjacent to the source region. The source electrode may be provided on the base region and be electrically connected to the source region. The front surface region may be provided on an entirety of the frontmost surface of the base region in a region differing from the source region and the partial region covered by the gate electrode in the base region, be electrically connected to the source electrode provided on the base region, and have a lower impurity concentration of impurities of the second conductivity type than the source region.

According to a third aspect of the present invention, provided is a semiconductor chip comprising the super junction MOSFET device described above and a free wheeling diode connected in parallel with the super junction MOSFET device.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
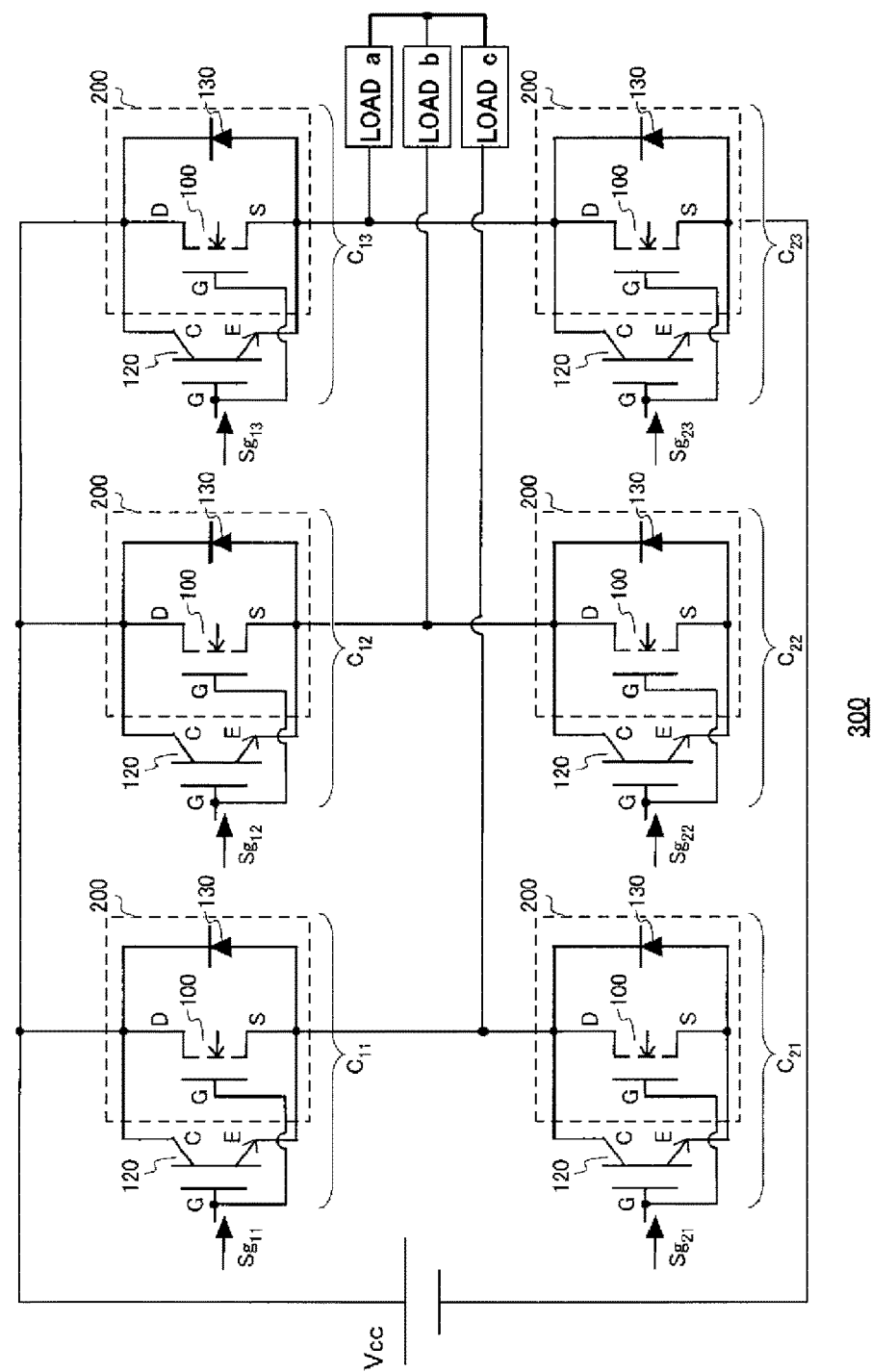
FIG. 1 shows an exemplary inverter apparatus 300.

FIG. 1 shows an exemplary inverter apparatus 300. The inverter apparatus 300 of this example includes a DC power supply Vcc, six circuit blocks $C_{xy}$ (x and y are each a natural number from 1 to 3), and loads a to c. The circuit blocks $C_{11}$ and $C_{21}$ are connected in series to form a first arm. Similarly, the circuit blocks $C_{12}$ and $C_{22}$ are connected in series to form a second arm, and the circuit blocks $C_{13}$ and $C_{23}$ are connected in series to form a third arm. The first arm, the second arm, and the third arm are connected in parallel with each other. The drain terminals (D) and collector terminals (C) of the circuit blocks $C_{11}$, $C_{12}$, and $C_{13}$ are connected to the positive potential of Vcc. The source terminals (S) and the emitter terminals (E) of the circuit blocks $C_{21}$, $C_{22}$, and $C_{23}$ are connected to the negative potential of Vcc.

Each circuit block $C_{xy}$ includes an IGBT device 120, an SJ MOSFET device 100, and a FWD 130 connected in parallel. The gates (G) of the SJ MOSFET device 100 and the IGBT device 120 are electrically connected to each other. A gate signal $Sg_{xy}$ is input from the outside to the gate (G) of one circuit block $C_{xy}$. In this way, the gates (G) are turned ON and OFF. In other words, each circuit block $C_{xy}$ is turned ON and OFF.

In the following description, in a case where the circuit block $C_{xy}$ on the positive potential side of Vcc in an arm is ON and the circuit block $C_{xy}$ on the negative potential side of Vcc in this arm is OFF, this arm is described as being H (abbreviation of "High"). On the other hand, in a case where the circuit block $C_{xy}$ on the positive potential side of Vcc in an arm is OFF and the circuit block $C_{xy}$ on the negative potential side of Vcc in this arm is ON, this arm is described as being L (abbreviation of "Low"). In this example, the (first arm, second arm, third arm) state is sequentially changed to (H, L, L), (H, H, L), (L, H, L), (L, H, H), (L, L, H), and (H, L, H), and then returned to (H, L, L). In this way, by suitably turning each circuit block $C_{xy}$ ON and OFF, it is possible to cause a three-phase alternating current to flow through the loads a to c using the DC power supply Vcc.

For example, at a certain timing, the circuit block $C_{11}$ is set to ON by $Sg_{11}$, the circuit block $C_{22}$ is set to ON by $Sg_{22}$, and the circuit block $C_{23}$ is set to ON by $Sg_{23}$. At this time, the circuit blocks $C_{21}$, $C_{12}$, and $C_{13}$ are set to OFF. In this way, the (first arm, second arm, third arm) state of (H, L, L) is realized.

As another example, at a different timing, the circuit block $C_{11}$ is set to ON by $Sg_{11}$, the circuit block $C_{12}$ is set to ON by $Sg_{12}$, and the circuit block $C_{23}$ is set to ON by $Sg_{23}$. At this time, the circuit blocks $C_{21}$, $C_{22}$, and $C_{13}$ are set to OFF. In this way, the (first arm, second arm, third arm) state of (H, H, L) is realized.

When the circuit block $C_{xy}$ is changed from ON to OFF, a reverse bias is applied to the SJ MOSFET device 100 of the circuit block $C_{xy}$. The SJ MOSFET device 100 of this example includes a front surface region, which is described further below, and can therefore increase Vf of the body diode without electron beam irradiation. For example, the SJ MOSFET device 100 can cause Vf to be greater than or equal to 4 [V]. As a result, even when Vf of the FWD 130 is greater than or equal to 2 [V] and less than or equal to 3 [V], the surge current when the device is OFF flows through the FWD 130 and not through the SJ MOSFET device 100. Furthermore, since Vf of the FWD 130 is less than or equal to the Vf value of the SJ MOSFET device 100, e.g. less than or equal to approximately 4 [V], the surface area of the FWD 130 can be reduced according to the Vf value compared to a case in which the SJ MOSFET device 100 does not include the front surface region.

In other words, in this example, it is possible to improve the current density of the FWD 130. As a result, an effect is achieved that it is easy to form the SJ MOSFET device 100 and the FWD 130 together in a single semiconductor chip 200. The IGBT device 120 of this example is provided to another single semiconductor chip. In another example, the IGBT device 120, the SJ MOSFET device 100, and the FWD 130 may each be provided on a separate semiconductor chip, and these semiconductor chips may be connected to each other using wires or the like.

Figure 2:
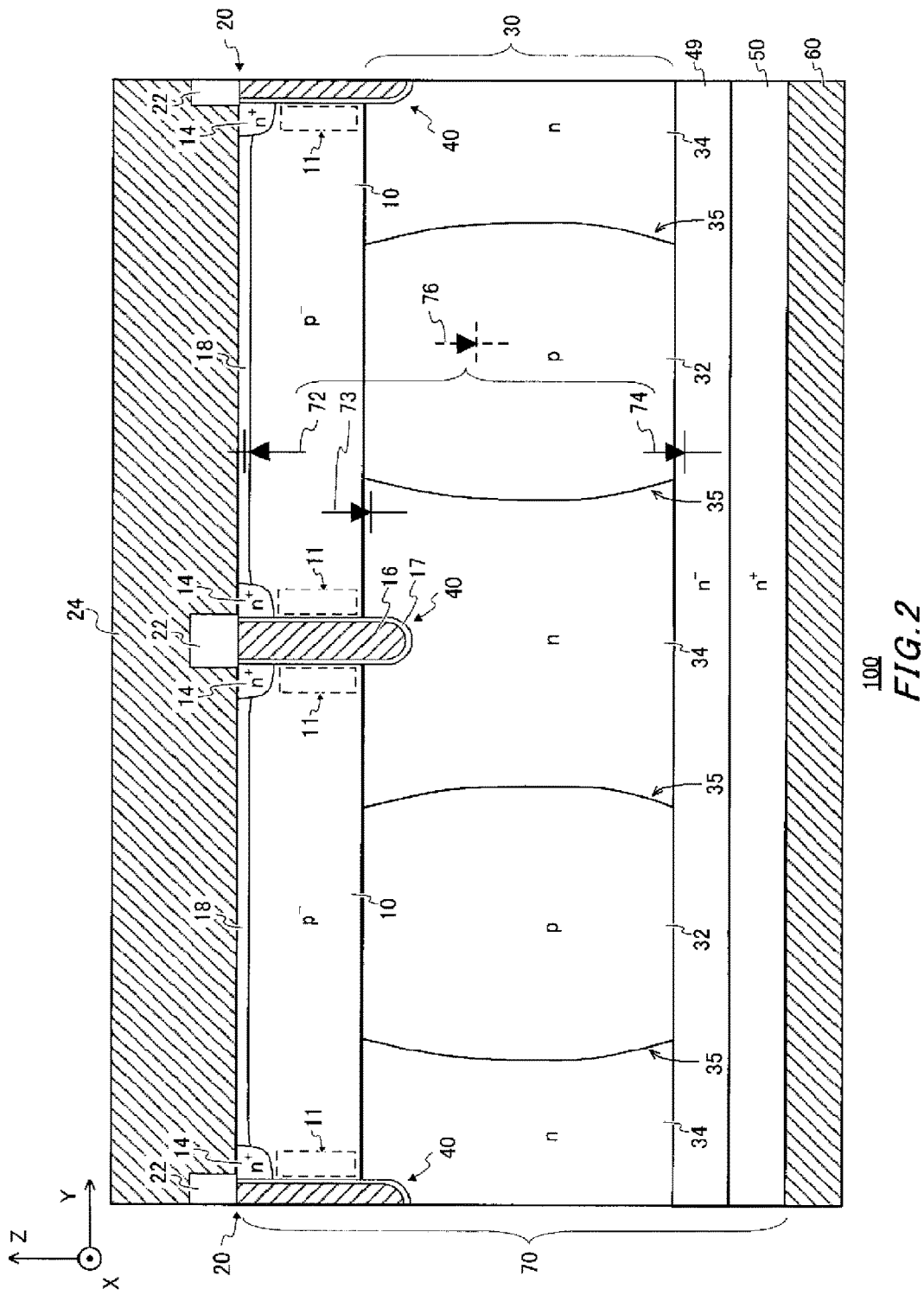
FIG. 2 shows a partial cross section of the SJ MOSFET device 100 according to a first embodiment.

FIG. 2 shows a partial cross section of the SJ MOSFET device 100 according to a first embodiment. The cross section of this example is obtained by cleaving a semiconductor substrate 70 in a plane (Y-Z plane) orthogonal to a primary surface 20 of the semiconductor substrate 70. The SJ MOSFET device 100 of this example includes the semiconductor substrate 70, a source electrode 24, and a drain electrode 60. The source electrode 24 is provided on the base region 10. The source electrode 24 is electrically connected to the source terminal (S) of a circuit block $C_{xy}$. The drain electrode 60 is provided under a drain region 50 and is electrically connected to the drain terminal (D) of the circuit block $C_{xy}$.

In this specification, "on" and "above" refer to the +Z direction. In contrast, "under" and "below" refer to the -Z direction. In this specification, the X direction and the Y direction are perpendicular to each other, and the Z direction is perpendicular to the X-Y plane. The X direction, the Y direction, and the Z direction form a so-called right-hand system. The Z direction does not necessarily refer to a direction perpendicular to the ground. The +Z direction of this example is from the drain electrode 60 toward the source electrode 24. Furthermore, the X-Y plane of this example is parallel to the primary surface 20.

The semiconductor substrate 70 of this example includes a base region 10, a source region 14, a front surface region 18, an SJ region 30, a gate trench 40, a buffer region 49, and the drain region 50. The base region 10 is provided on the primary surface 20 side of the semiconductor substrate 70. The base region 10 includes p$^-$-type impurities, which are impurities of a first conductivity type. The base region 10 may have a p-type impurity concentration greater than or equal to E+16 [cm$^{-3}$] and less than or equal to E+20 [cm$^{-3}$], more preferably greater than or equal to E+16 [cm$^{-3}$] and less than or equal to E+18 [cm$^{-3}$]. The base region 10 forms a channel region 11 near a gate insulating film 17 when a prescribed positive potential is applied to a gate electrode 16. In this specification, E represents 10 raised to a certain power, e.g. E+16 represents $10^{16}$ and E-16 represents $10^{-16}$.

In this specification, n and p refer to carriers of which the majorities are respectively electrons and holes. Furthermore, concerning the + and − signs to the upper right of n and p, the + sign means that the carrier concentration is higher than in a case where no sign is written and the − sign means that the carrier concentration is lower than in a case where no sign is written. In this specification, the first conductivity type is p-type and the second conductivity type is n-type. However, in another example, the first conductivity type may be n-type and the second conductivity type may be p-type.

The source region 14 includes a portion of the frontmost surface of the base region 10. In this example, the frontmost surface of the base region 10 is the primary surface 20 of the semiconductor substrate 70. The source region 14 of this example is provided in a manner to sandwich the gate trench 40. The length of the source region 14 in the Y direction may be approximately 5 [μm]. The source region 14 has n$^+$-type impurities, which are impurities of the second conductivity type. The source region 14 is electrically connected to the source electrode 24.

The SJ region 30 is provided under the base region 10. The SJ region 30 of this example is provided in direct contact with the base region 10. The SJ region 30 includes a p-type column 32 as a first column having impurities of the first conductivity type and an n-type column 34 as a second column having impurities of the second conductivity type. A plurality of p-type columns 32 and n-type columns 34 are arranged periodically in the Y direction in an alternating manner. In this example, the pitch period of the SJ region 30 is less than or equal to approximately 20 μm. The boundary 35 is a boundary between an n-type column 34 and a p-type column 32 adjacent to this n-type column 34.

The buffer region 49 is provided under the SJ region 30 in direct contact with the SJ region 30. The buffer region 49 includes n$^-$-type impurities. The drain region 50 is provided under the buffer region 49. The drain region 50 includes n$^+$-type impurities. In this example, the n-type impurity concentration of the buffer region 49 is approximately from E+14 [cm$^{-3}$] to E+16 [cm$^{-3}$]. Also in this example, the n-type impurity concentration of the drain region 50 is approximately from E+18 [cm$^{-3}$] to E+21 [cm$^{-3}$]. The drain electrode 60 is provided under the drain region 50. When the prescribed positive potential is applied to the gate electrode 16 to form the channel region 11, current flows from the drain electrode 60 to the source electrode 24 through the drain region 50, the buffer region 49, the n-type column 34, the channel region 11, and the source region 14.

The gate trench 40 is provided penetrating through the base region 10. The gate trench 40 of this example reaches from a portion of the frontmost surface of the base region 10 to the n-type column 34. The gate trench 40 includes the gate electrode 16 and the gate insulating film 17 formed conformally in a plurality of gate trenches 40. The gate electrode 16 is also provided penetrating through the base region 10. The gate electrode 16 is electrically separated from the source electrode 24 by the interlayer insulating film 22, and is electrically connected to a gate terminal (G) of the circuit block $C_{xy}$.

The front surface region 18 is provided on the entire frontmost surface of the base region 10, in a region differing from the region where the source region 14 and the gate electrode are provided in the base region 10. The front surface region 18 is electrically connected to the source electrode 24. In this example, the front surface region 18 is provided on the entire primary surface 20 except for on the source region 14 and the gate trench 40. Here, the "entire surface" may refer to the entirety of the primary surface 20 in the active region of the semiconductor chip 200, or may refer to the primary surface 20 of the peripheral region that surrounds the active region in the semiconductor chip 200.

The base region 10 and the front surface region 18 form a front surface region diode 72. The base region 10 and the n-type column 34 form a first body diode 73. Also, the p-type column 32 and the buffer region 49 form a second body diode 74. The front surface region diode 72 and the first body diode 73 are connected in series and oriented in opposite directions. Similarly, the front surface region diode 72 and the second body diode 74 are connected in series and oriented in opposite directions.

During a reverse bias, i.e. when the circuit block $C_{xy}$ is OFF, the source electrode 24 has a higher potential than the drain electrode 60. In this example, during a reverse bias, i.e. when the circuit block $C_{xy}$ is OFF, current does not flow from the source electrode 24 of the SJ MOSFET device 100 to the drain electrode 60. In this example, the current during a reverse bias flows to the FWD 130, but in the SJ MOSFET device 100, a potential difference occurs between the base region 10 and the front surface region 18, which makes it more difficult for the current to flow and increases Vf. Therefore, current does not flow as long as a voltage exceeding the potential difference corresponding to Vf of the SJ MOSFET device 100 is not applied to the composite body diode 76.

Supposing there is a case where the front surface region 18 has the same n-type impurity concentration as the source region 14 and the same depth as the source region 14, since the potential difference between the base region 10 and the front surface region 18 becomes large, it is difficult for the depletion layer to spread to the base region 10 and the p-type column 32. Therefore, in order to spread the depletion layer to the base region 10 and the p-type column 32, in this example, the n-type impurity concentration of the front surface region 18 is set to be greater than or equal to the p-type impurity concentration of the base region 10, and the depth of the front surface region 18 in the −Z direction is set to be less than the depth of the source region 14 in the −Z direction. In this way, the potential difference is lowered and the depletion layer easily spreads within the base region 10 and the p-type column 32. Accordingly, the composite body diode 76 can maintain the breakdown voltage during a reverse bias.

The front surface region 18 of this example has a lower n-type impurity concentration than the source region 14. The n-type impurity concentration of the source region 14 may be greater than or equal to E+17 [cm$^{-3}$] and less than or equal to E+21 [cm$^{-3}$]. The impurity concentration of the front surface region 18 may be determined according to the breakdown voltage. The impurity concentration of the front surface region 18 may be at least equal to the impurity concentration of the base region 10, and is preferably in a range from a concentration equal to the impurity concentration of the base region 10 to an impurity concentration double that of the base region 10 when the breakdown voltage is 600 V, for example.

In this example, by providing the front surface region 18, Vf of the composite body diode 76 of the SJ MOSFET device 100 can be increased beyond Vf of the FWD 130 connected in parallel. Furthermore, in this example, since Vf of the SJ MOSFET device 100 is not increased by electron beam irradiation, it is possible to eliminate the electron beam irradiation. Therefore, it is possible to realize a leak current equivalent to that of the conventional technology.

Figure 3:
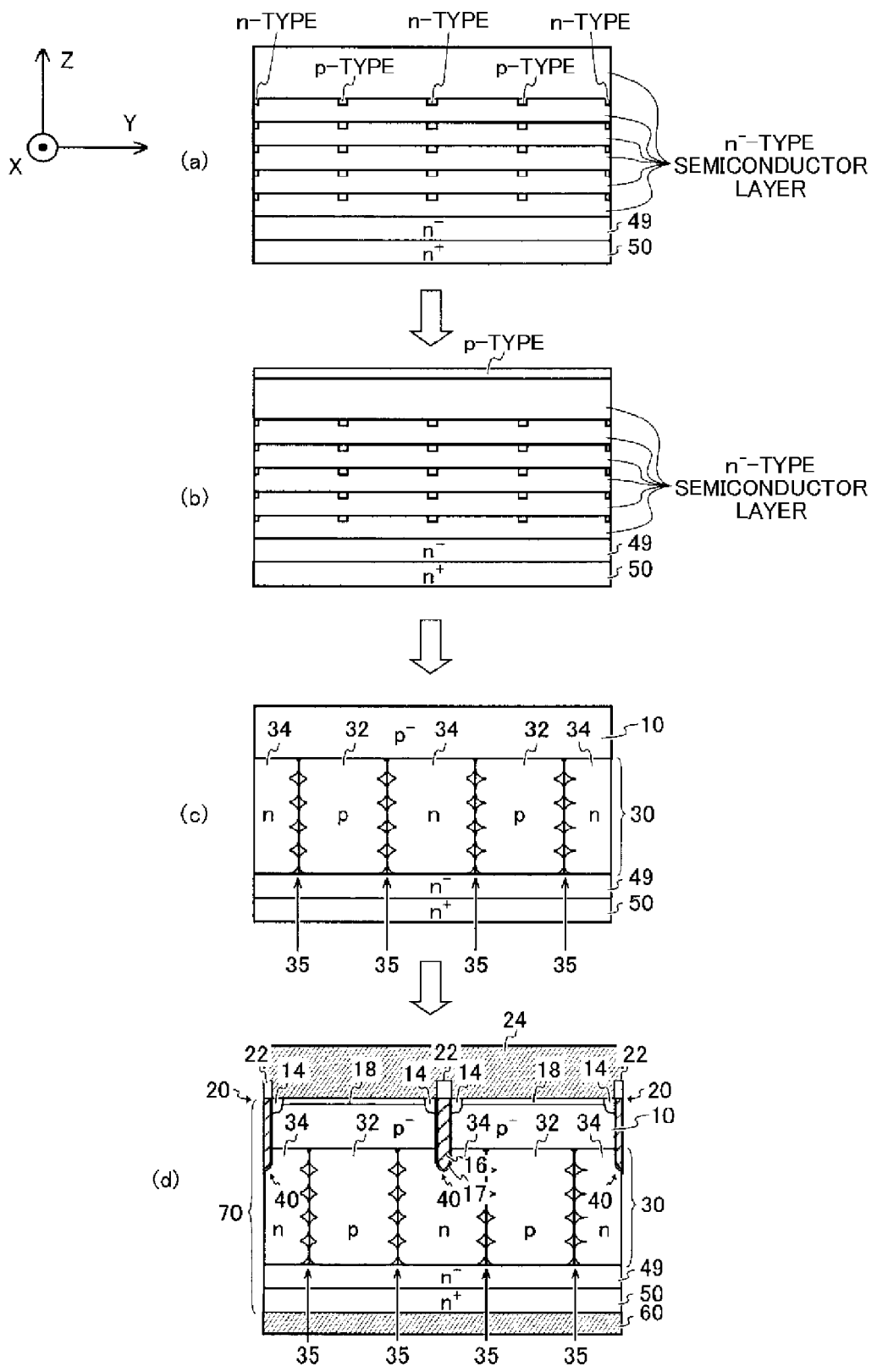
FIG. 3 is a drawing for describing the SJ MOSFET device 100 manufacturing method.

FIG. 3 is a drawing for describing the SJ MOSFET device 100 manufacturing method. First, as shown in portion (a) of FIG. 3, n$^-$-type impurities and p-type impurities are injected respectively at different regions of the n$^-$-type semiconductor layer formed as a multistage layer. This technique is referred to as multistage epitaxy. With multistage epitaxy, first, an n$^-$-type semiconductor layer with a prescribed thickness is epitaxially grown on the buffer region 49 (step 1). The impurity concentration of the n$^-$-type semiconductor layer is preferably from E+13 [cm$^{-3}$] to 5E+14 [cm$^{-3}$]. Also, the thickness of the n$^-$-type semiconductor layer is preferably less than or equal to 10 μm. Next, p-type impurities (e.g. boron (B)) and n-type impurities (e.g. phosphorous (P)) are respectively injected at different positions in the n-type semiconductor substrate having the prescribed thickness (step 2). Step 1 and step 2 are repeated a plurality of times. The n$^-$-type semiconductor layer preferably has less than or equal to 10 stages. The uppermost stage forms an n$^-$-type semiconductor layer into which ion injection of p-type impurities and n-type impurities is not performed.

Next, as shown in portion (b) of FIG. 3, photolithography and ion injection are performed to the locations where the base region 10 is to be formed, and p-type impurities are injected.

Next, as shown in portion (c) of FIG. 3, the n-type impurities and p-type impurities are spread within the n$^-$-type semiconductor layer. By performing thermal processing, the region into which the p-type impurities were injected becomes the p-type column 32 and the region into which the n-type impurities were injected becomes the n-type column 34. Also, at the same time, the base region 10 is formed in the n$^-$-type semiconductor layer that is the uppermost stage in which ion injection of the n-type impurities and p-type impurities was not performed.

Furthermore, after this, the gate trench 40 is formed using known photolithography and etching techniques. In this example, first, etching is used to form the gate trench 40. After this, silicon oxide or the like is formed as the gate insulating film 17 inside the gate trench 40 using thermal oxidization or CVD. After this, polysilicon or the like is formed as the gate electrode 16 on the gate insulating film 17 using CVD.

Next, n-type impurities are injected into the primary surface 20 using photolithography techniques and ion injection. In this way, the n$^+$-type source region 14 and the n-type front surface region 18 are formed. For example, there is an opening in the top of the source region 14 and n-type impurities are injected while using a photoresist covering the entire front surface region 18 as a mask. After this, the photoresist is removed and the n-type impurities are injected into the source region 14 and the n-type front surface region 18. After this, the semiconductor substrate 70 is thermally processed.

Next, the interlayer insulating film 22, the source electrode 24, and the drain region 50 are formed. Silicon oxide or the like is formed as the interlayer insulating film 22 on the gate electrode 16 using known lithography and etching techniques. After this, the source electrode 24 is formed on the primary surface 20 using sputtering or the like and the drain electrode 60 is formed under the drain region 50 using sputtering or the like. In this way, the SJ MOSFET device 100 shown in portion (d) of FIG. 3 is completed.

FIG. 2 omits the lines indicating the spread state of the p-type column 32 and the n-type column 34 shown in portions (b) to (d) of FIG. 3. Similarly, in the following drawings, the lines indicating the spread state of the p-type column 32 and the n-type column 34 are omitted.

Figure 4:
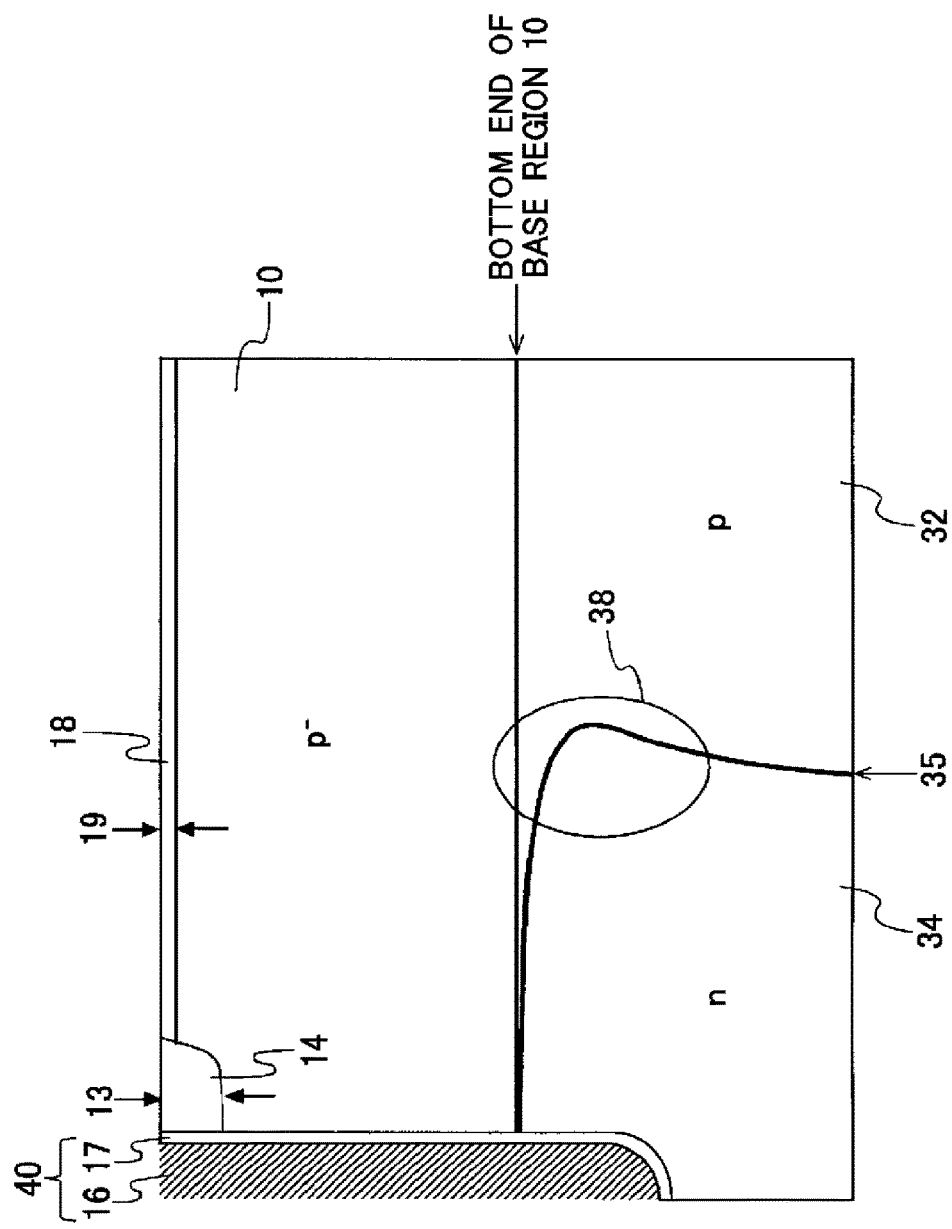
FIG. 4 is an enlarged view of the region near the primary surface 20 at the boundary 35.

FIG. 4 is an enlarged view of the region near the primary surface 20 at the boundary 35. The source region 14 of this example has an n-type impurity concentration of approximately E+20 [cm$^{-3}$] and the front surface region 18 of this example has an n-type impurity concentration of approximately E+17 [cm$^{-3}$]. The source region 14 of this example has a thickness 13 in the −Z direction and the front surface region 18 has a thickness 19 in the −Z direction. In this example, the thickness 19 of the front surface region 18 is less than the thickness 13 of the source region 14. Preferably, the thickness 19 of the front surface region 18 may be greater than or equal to 0.05 [μm] and less than or equal to 0.5 [μm]. Also, the thickness 13 of the source region 14 may be greater than or equal to 0.5 [μm]. The thickness 13 of the source region 14 may be the same as the thickness of the front surface region 18, in a case where the n-type impurity concentration of the front surface region 18 is less than the n-type impurity concentration of the front surface region 18 such that the potential difference between the base region 10 and the front surface region 18 is as small as possible.

As shown in FIG. 4, the upper portion of the n-type column 34 includes a protruding portion 38 that protrudes toward the p-type column 32 side at the boundary 35 between the p-type column 32 and the n-type column 34. When forming the SJ region 30 using multistage epitaxial growth, the protruding portion 38 is formed as a result of the n-type impurities (phosphorous (P) in this example) spreading more easily than the p-type impurities (boron (B) in this example).

Figure 5:
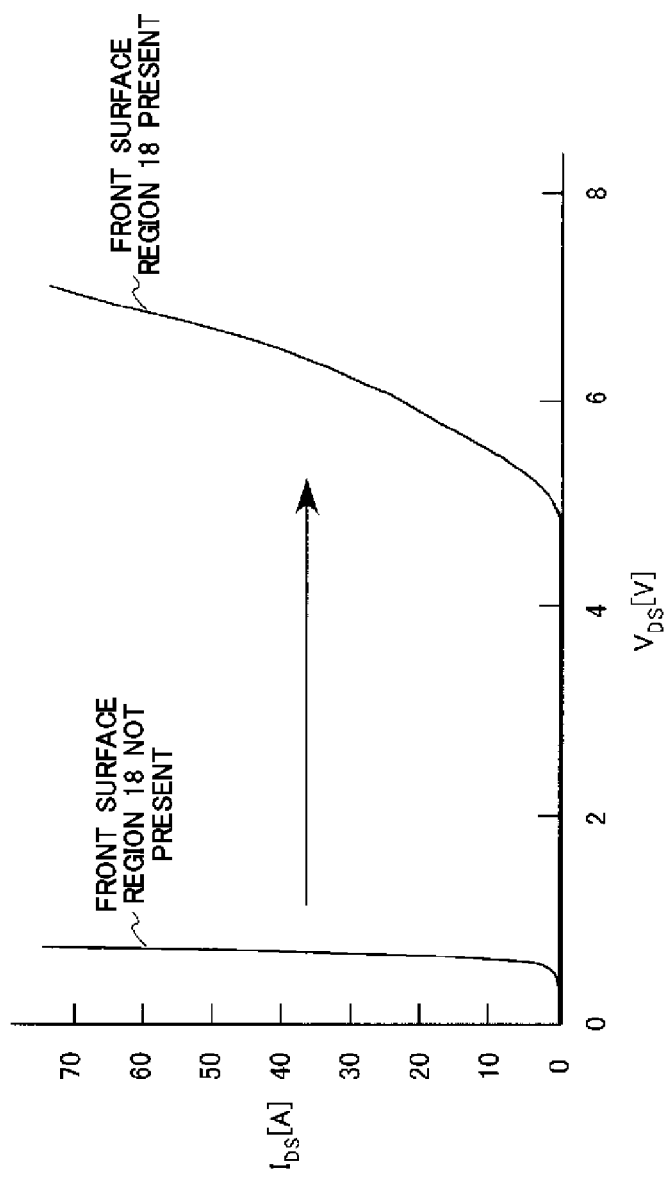
FIG. 5 shows the current [A]-voltage [V] characteristic corresponding to the presence or lack of the front surface region 18.

FIG. 5 shows the current [A]-voltage [V] characteristic corresponding to the presence or lack of the front surface region 18. The horizontal axis indicates the potential difference $V_{DS}$ [V] of the source (S) relative to the drain (D), which is the magnitude of the reverse bias voltage in this example. The vertical axis indicates the reverse bias current $I_{DS}$ [A] that flows from the source (S) through the drain (D). In this example, $I_{Ds}$ [A] is simulated in a case where $V_{DS}$ [V] applied to the SJ MOSFET device 100 is gradually increased.

In a case where the front surface region 18 is not present in the SJ MOSFET device 100, $I_{DS}$ begins flowing when $V_{DS}$ is approximately 0.4 [V]. When $V_{DS}$ is approximately 0.8 [V], $I_{DS}$ increases sharply. In contrast, in a case where the front surface region 18 is present in the SJ MOSFET device 100, $I_{DS}$ begins flowing when $V_{DS}$ is approximately 4.8 [V]. Furthermore, $I_{DS}$ gradually increases in accordance with the increase of $V_{DS}$. In this way, in a case where the front surface region 18 is present, Vf of the composite body diode 76 of the SJ MOSFET device 100 is greater than or equal to 4 [V].

Figure 6A:
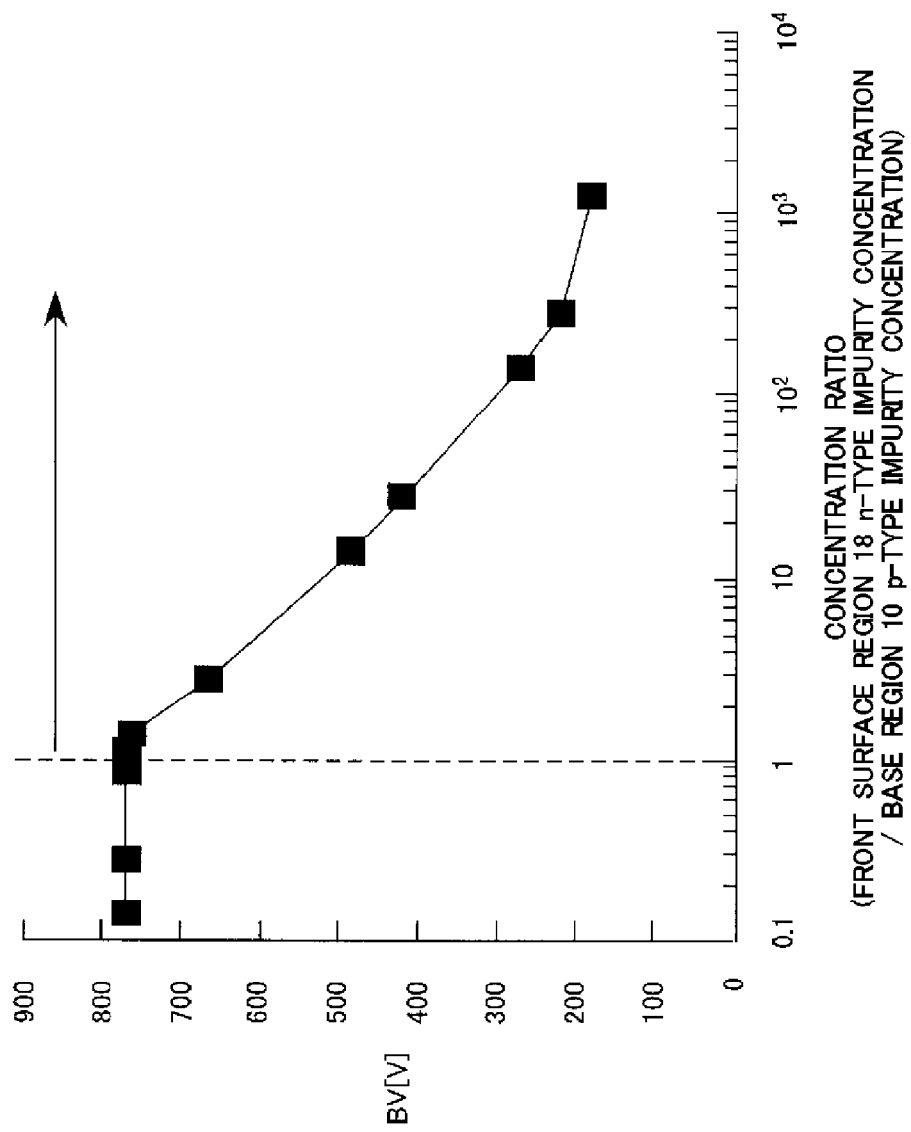
FIG. 6A shows the breakdown voltage BV relative to the impurity concentration in a case where the front surface region 18 is present.

FIG. 6A shows the breakdown voltage BV relative to the impurity concentration in a case where the front surface region 18 is present. The horizontal axis indicates the impurity concentration ratio using the p-type impurity concentration of the base region 10 as the denominator and the n-type impurity concentration of the front surface region 18 as the numerator. The horizontal axis uses logarithmic representation. The vertical axis indicates the breakdown voltage BV of the SJ MOSFET device 100 when a reverse bias is applied.

When the concentration ratio is in a range of greater than or equal to 0.1 and less than or equal to 1, BV is at a mostly constant value that is greater than or equal to 760 [V] and less than or equal to 780 [V]. Here, BV begins to gradually decrease when the concentration ratio is in a range from 1 to 2. When the concentration ration is 1,000, BV decreases to approximately 200 [V]. When the concentration ratio is in a range of greater than or equal to 0.1 and less than or equal to 1, the breakdown voltage is extremely high but, as made clear from FIG. 6B, Vf is less than 1 [V] and therefore unsuitable when the concentration ratio is in this range.

Figure 6B:
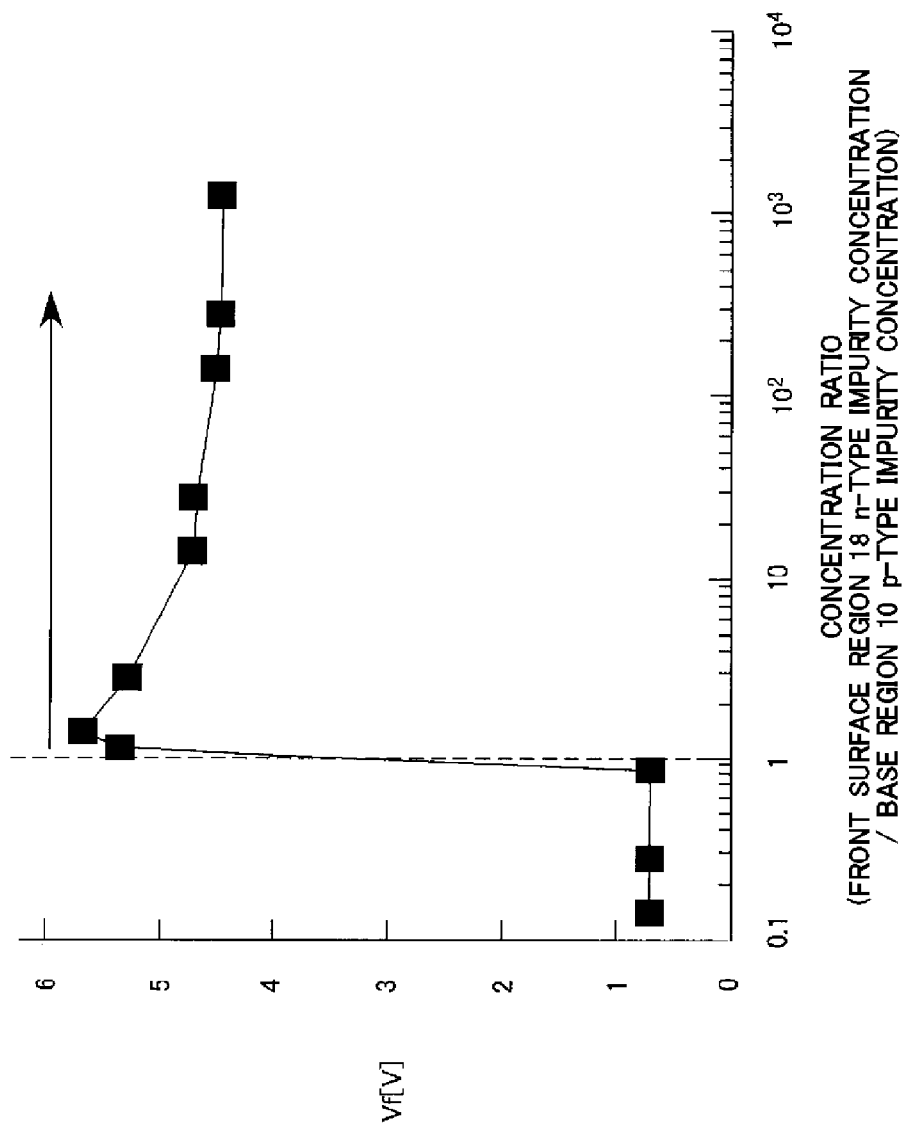
FIG. 6B shows the forward voltage Vf relative to the impurity concentration in a case where the front surface region 18 is present.

FIG. 6B shows the forward voltage Vf relative to the impurity concentration in a case where the front surface region 18 is present. The horizontal axis is the same as in FIG. 6A. The vertical axis shows Vf [V] of the SJ MOSFET device 100. When the concentration ratio is in a range of greater than or equal to 0.1 and less than or equal to 1, Vf is mostly constant at a value greater than or equal to 0.6 [V] and less than or equal to 0.8 [V]. In contrast, when the concentration exceeds 1, Vf increases sharply. This is due to the formation of the front surface region diode 72. When the concentration ratio is greater than or equal to 1 and less than or equal to 2, Vf is at a maximum value that is greater than or equal to 5.6 [V] and less than or equal to 5.8 [V]. Furthermore, Vf begins decreasing in accordance with an increase of the concentration ratio, and drops to a value greater than or equal to 4.4 [V] and less than or equal to 4.6 [V] when the concentration ratio is 1,000.

Based on the results shown in FIGS. 6A and 6B, the ratio of the n-type impurity concentration of the front surface region 18 to the p-type impurity concentration of the base region 10 may be greater than or equal to 1 and less than or equal to 1,000, more preferably greater than or equal to 1 and less than or equal to 5. When the concentration ratio is 5, BV is approximately 580 [V] (FIG. 6A) and Vf is greater than or equal to 5.0 [V] and less than or equal to 5.2 [V] (FIG. 6B). As a result, it is possible to set a breakdown voltage value to be the rated voltage of the SJ MOSFET device 100 while keeping Vf of the SJ MOSFET device 100 at a value greater than or equal to 4 [V] according to the impurity concentration ratio.

Figure 7:
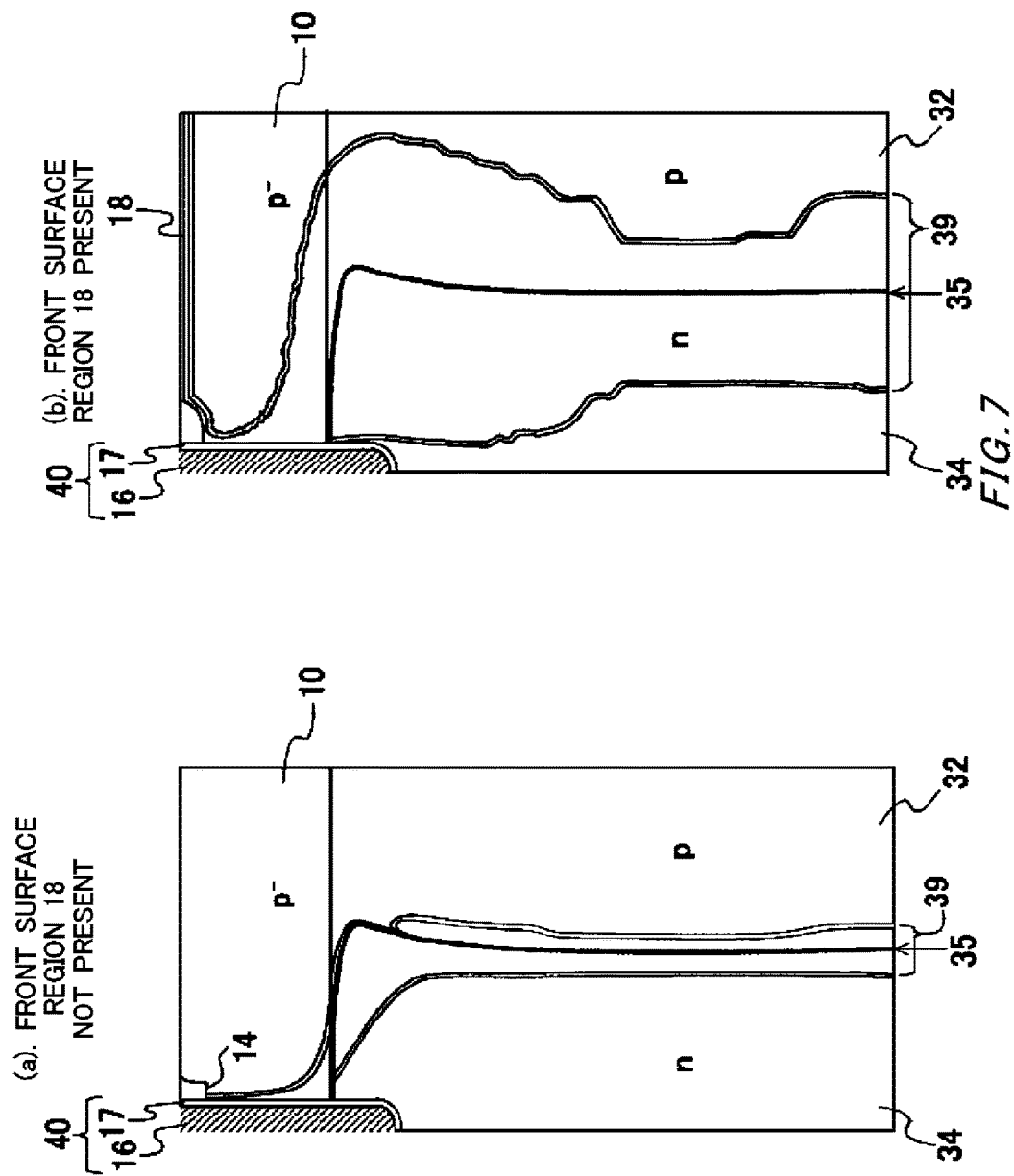
FIG. 7 includes portion (a) that shows a depletion layer 39 in a case where the front surface region 18 is not present and portion (b) that shows the depletion layer 39 in a case where the front surface region 18 is present.

Portion (a) of FIG. 7 shows the depletion layer 39 in a case where the front surface region 18 is not present. Portion (b) in FIG. 7 shows the depletion layer 39 in a case where the front surface region 18 is present. As described above, the SJ MOSFET device 100 is repeatedly turned ON and OFF. Portions (a) and (b) are simulation results showing the depletion layer 39 at a time when the SJ MOSFET device 100 is temporarily turned OFF and then turned ON.

The ease with which the electron current flows is caused by the spreading of the depletion layer 39 near the boundary 35. Comparing the spreading of the depletion layer 39 in portions (a) and (b), the depletion layer 39 spreads less in portion (a), which is the case where the front surface region 18 is not present, than in portion (b), which is the case where the front surface region 18 is present. Therefore, the electron current flows more easily in the case shown in portion (a) than in the case shown in portion (b).

In portion (b), which is the case where the front surface region 18 is present, the depletion layer 39 spreads more easily when the SJ MOSFET device 100 is ON than in portion (a), which is a case where the front surface region 18 is not present. In portion (a), the base region 10 and the source electrode 24 have the same potential when the SJ MOSFET device 100 is ON. Therefore, in portion (a), the depletion layer 39 formed when the SJ MOSFET device 100 is ON shrinks when the SJ MOSFET device 100 is OFF. In contrast, in portion (b), when the voltage is less than or equal to the breakdown voltage of the front surface region diode 72 while the SJ MOSFET device 100 is ON, the base region 10 and the p-type column 32 are electrically separated from the source electrode 24, and therefore a floating state is created. Therefore, in portion (b), the potential that is less than or equal to the breakdown voltage of the front surface region diode 72 and the depletion layer 39 formed when the SJ MOSFET device 100 is ON remains as-is. In portion (b), the path (inversion layer portion) through which the electron current flows is limited by the depletion layer 39 that remains without being eliminated, and therefore the electron beam has more difficulty flowing when the SJ MOSFET device 100 is ON than in the case shown in portion (a).

Figure 8A:
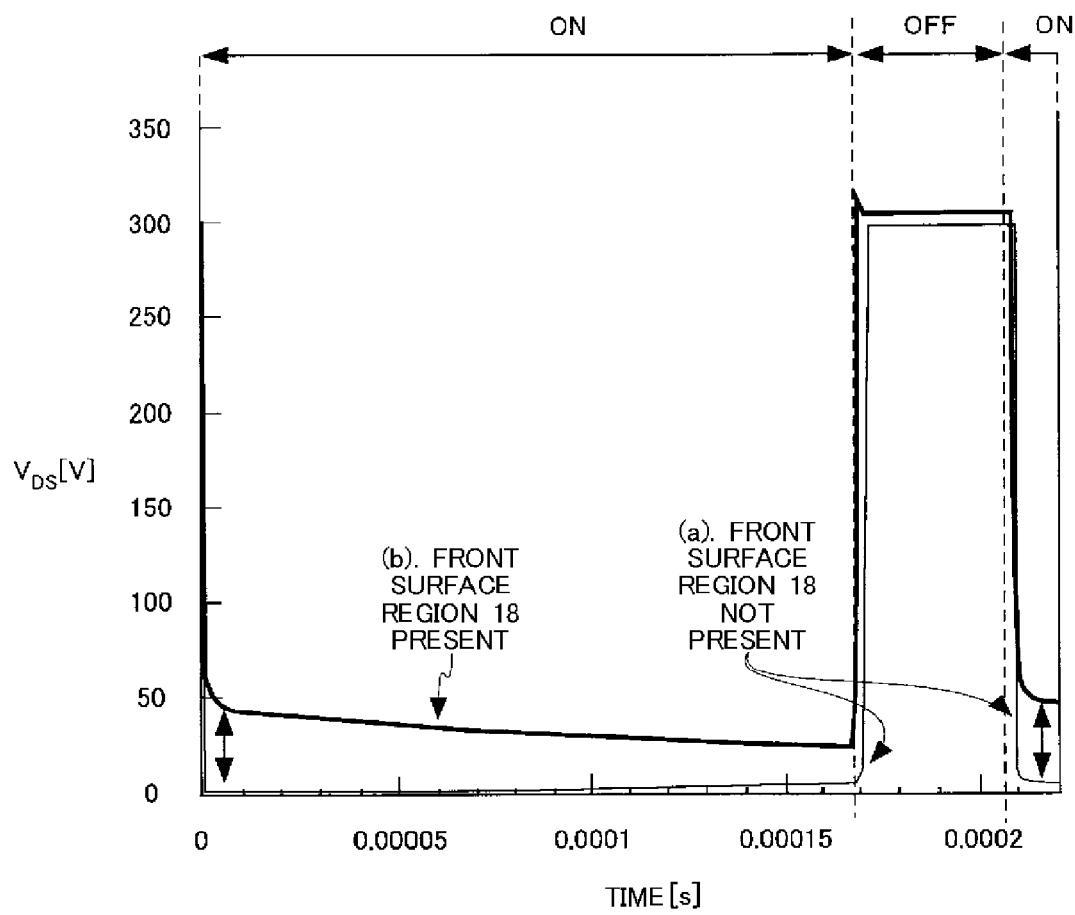
FIG. 8A shows the switching characteristic of the source-drain voltage $V_{DS}$.

FIG. 8A shows the switching characteristic of the source-drain voltage $V_{DS}$. The horizontal axis indicates time [s].

The vertical axis indicates the potential difference $V_{DS}$ [V] of the source (S) relative to the drain (D), which is the magnitude of the reverse bias voltage. A first ON state occurs from the timing 0 [s] to around the timing 0.00017 [s], a first OFF state occurs from around the timing 0.0002 [s] to around the timing 0.00017 [s], and a second ON state occurs from around the timing 0.0002 [s].

In portions (a) and (b) of FIG. 8A, the same potential is applied to the gate electrode 16, the source electrode 24, and the drain electrode 60. The thin lines indicate the switching characteristic in a case where the front surface region 18 is not present, as shown in portion (a). The thick lines indicate the switching characteristic in a case where the front surface region 18 is present, as shown in portion (b). As made clear from this simulation, $V_{DS}$ [V] occurring when the SJ MOSFET device 100 is ON is higher when the front surface region 18 is present, as shown in portion (a), than when the front surface region 18 is not present, as shown in portion (b) (see the arrows in the drawing). In other words, the potential of the source electrode 24 when the SJ MOSFET device 100 is ON is higher in the case shown in portion (b) than in the case shown in portion (a). This is because, in the case shown in portion (b), the depletion layer 39 remaining when the SJ MOSFET device 100 is ON acts as a resistance component.

Figure 8B:
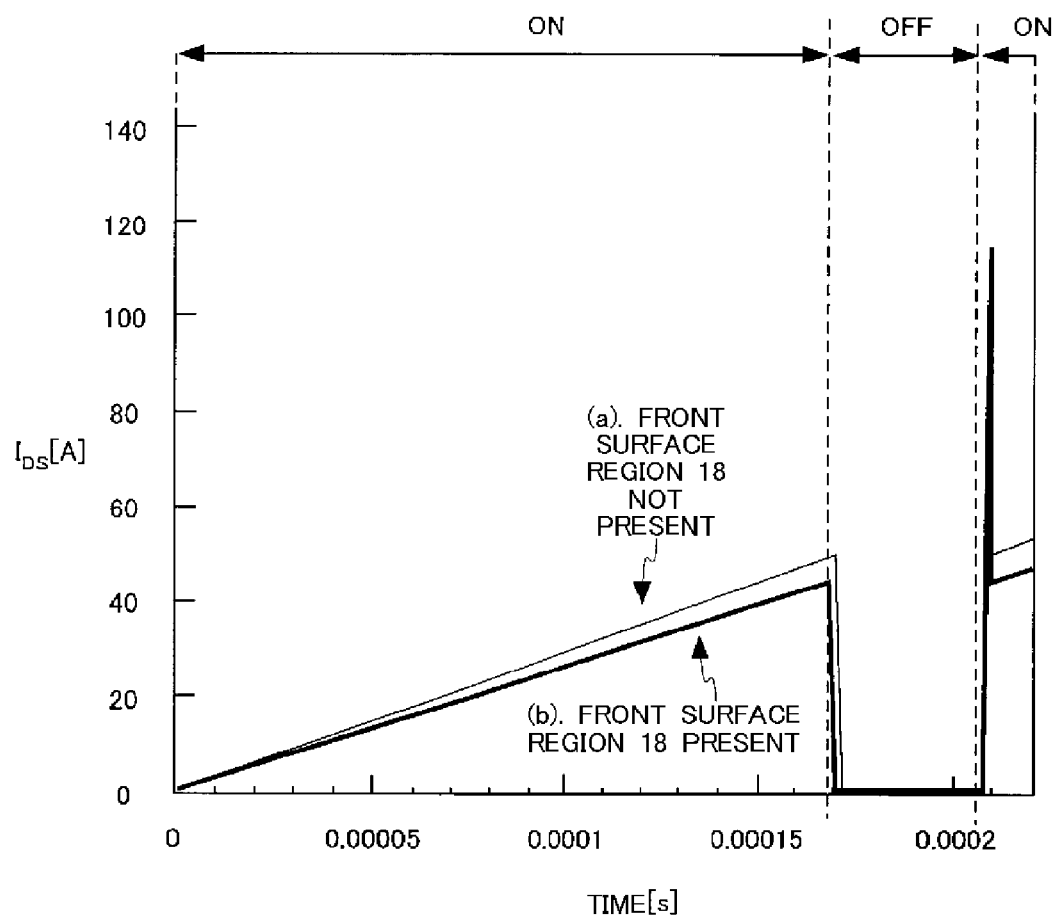
FIG. 8B shows the switching characteristic of the source-drain current $I_{DS}$.

FIG. 8B shows the switching characteristic of the source-drain current $I_{DS}$. The horizontal axis indicates time [s]. The vertical axis indicates the current $I_{DS}$ [A] flowing from the drain (D) to the source (S), which is the magnitude of the current when a forward bias is applied. The conditions concerning the ON and OFF timings and the potential applied to each electrode are the same as in FIG. 8A. As made clear from this simulation, $I_{DS}$ [A] when the SJ MOSFET device 100 is ON is lower in the case where the front surface region 18 is present, as shown in portion (b), than in the case where the front surface region 18 is not present, as shown in portion (a). This is because, in the case shown in portion (b), a large amount of the depletion layer 39 remains when the SJ MOSFET device 100 is ON, and this makes it more difficult for the current to flow. Therefore, countermeasures may be applied for dealing with the large amount of the depletion layer 39 remaining when the SJ MOSFET device 100 is ON.

Figure 9:
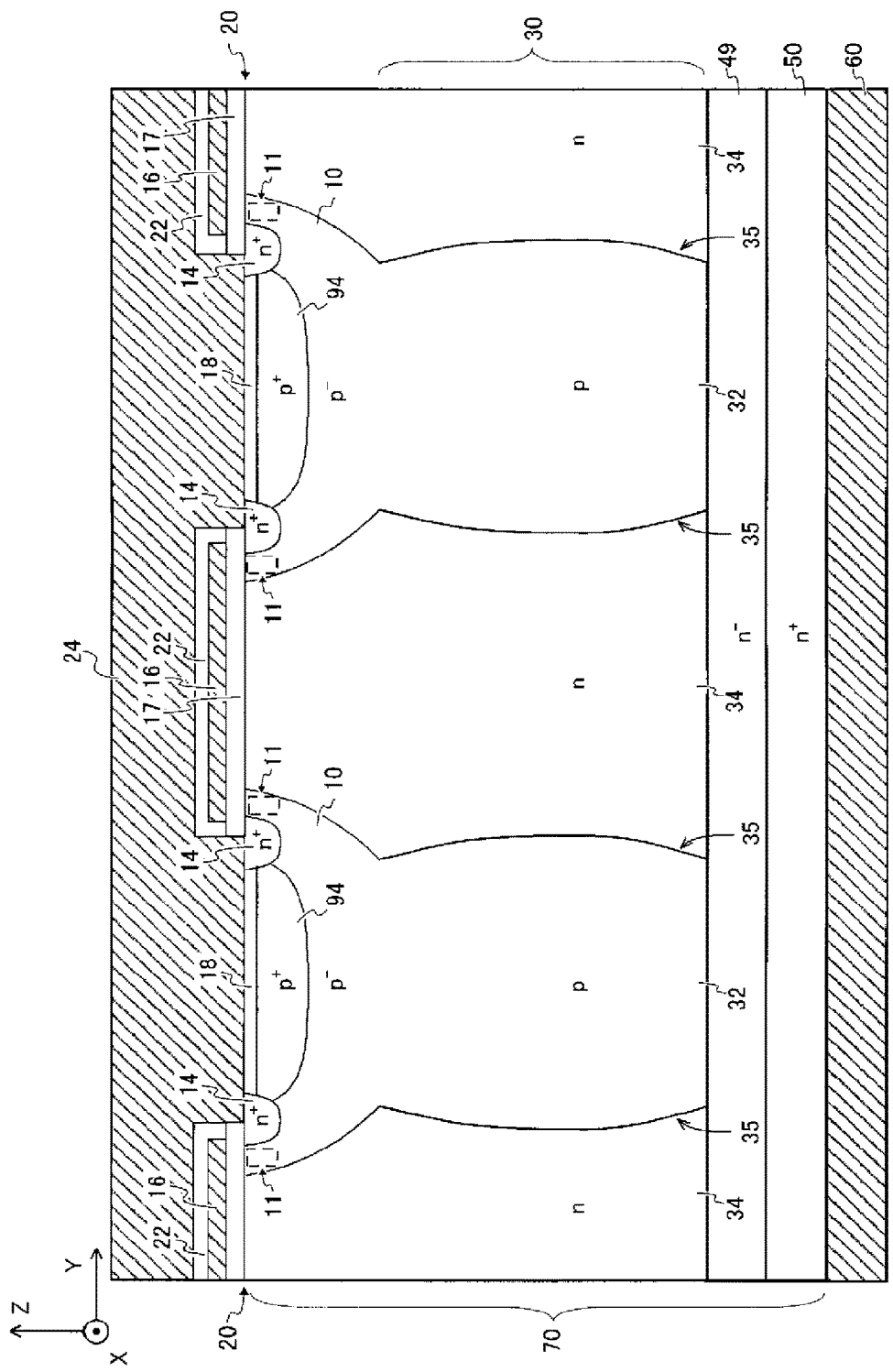
FIG. 9 shows a partial cross section of an SJ MOSFET device 100 according to a second embodiment.

FIG. 9 shows a partial cross section of an SJ MOSFET device 100 according to a second embodiment. The gate electrode 16 of this example has a so-called planar gate electrode structure. The base region 10 of this example is formed with a well shape on the p-type column 32. A channel region 11, a source region 14, a front surface region 18, and a contact region 94 are provided in the base region 10.

The front surface region 18 is provided on the entirety of the frontmost surface of the base region 10 in a region differing from the source region 14 and the channel region 11. The front surface region 18 of this example is provided on the contact region 94 between a pair of source regions 14. The contact region 94 has $p^+$-type impurities.

The gate electrode 16 of this example is provided on the base region 10 in a manner to sandwiched the gate insulating film 17 therebetween. A gate electrode 16 is also provided on the n-type column 34 adjacent to the base region 10 in the Y direction. The gate electrode 16 covers a partial region of the base region 10 that differs from the source region 14. This partial region of the base region 10 may correspond to the channel region 11. The interlayer insulating film 22 is provided covering the top surface and side surfaces of the gate electrode 16, and electrically isolates the gate electrode 16 and the source electrode 24 from each other.

The second embodiment differs from the first embodiment with regard to the points described above. All other points of the second embodiment are the same as in the first embodiment.

Figure 10:
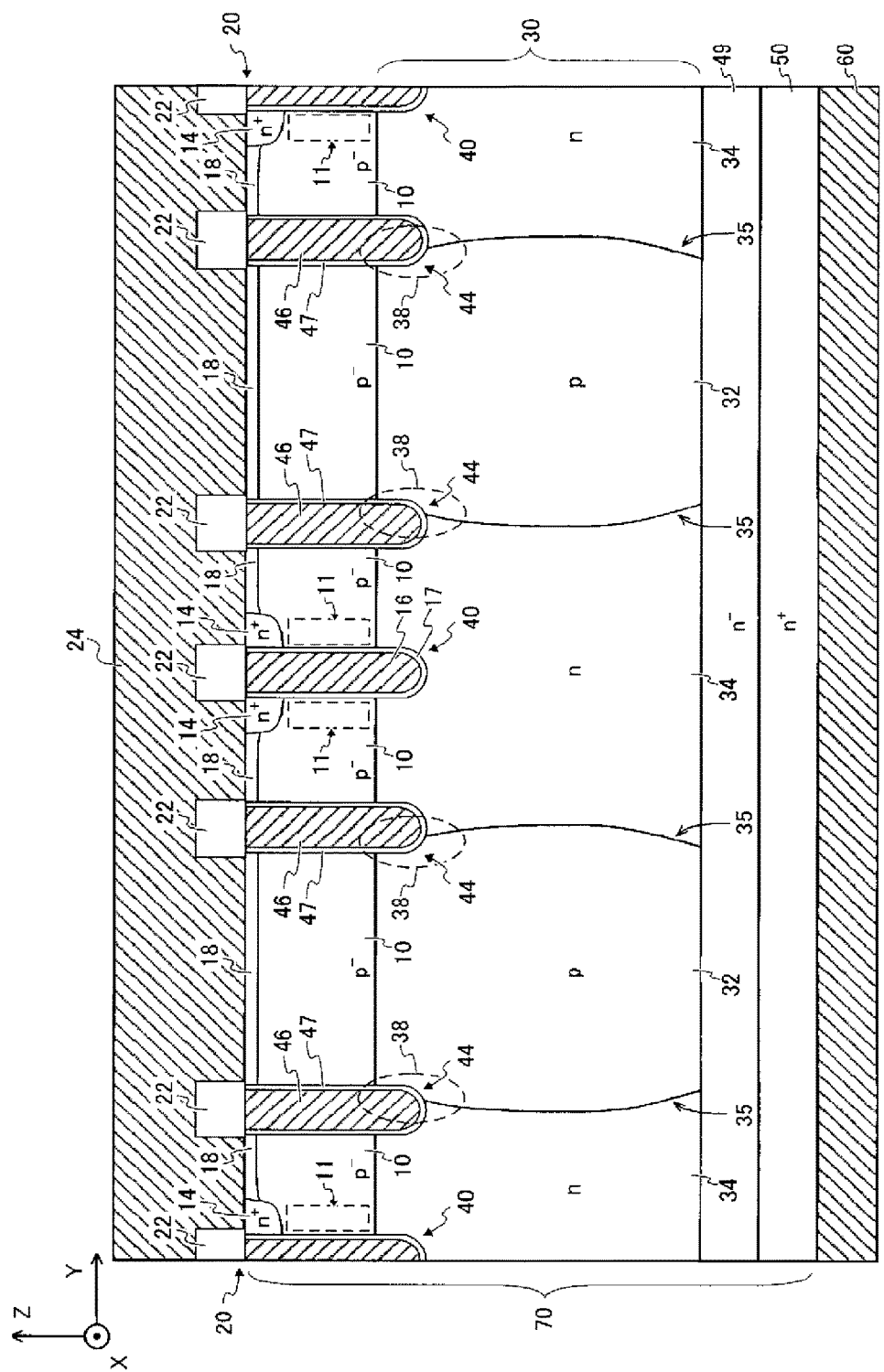
FIG. 10 shows a cross section of an SJ MOSFET device 100 according to a third embodiment.

FIG. 10 shows a cross section of an SJ MOSFET device 100 according to a third embodiment. The SJ MOSFET device 100 of this example further includes a separation trench 44, as a countermeasure applied to deal with the depletion layer 39 that remains without being eliminated when the SJ MOSFET device 100 is OFF. The third embodiment differs from the first embodiment with regard to this point. All other points of the second embodiment are the same as in the first embodiment.

The separation trench 44 of this example includes a trench insulating film 47 formed therein in a manner to be shared by a plurality of separation trenches 44, and a trench electrode 46 provided in contact with the trench insulating film 47. The trench electrode 46 is electrically connected to either the gate electrode 16 or the source electrode 24. The separation trench 44 extends downward from a portion of the front surface region 18 and reaches the boundary 35. The bottommost portion of the separation trench 44 is positioned at the protruding portion 38 (see FIG. 4). By positioning the bottommost portion of the separation trench 44 at the protruding portion 38, the base region 10 and the p-type column 32 can be more reliably isolated from each other.

The separation trench 44 and the trench electrode 46 spatially distance the base region 10 and the p-type column 32 near the gate electrode 16 from each other. The separation trench 44 has a function of restricting the spreading of the depletion layer 39 to the channel region 11 (inversion layer) when the SJ MOSFET device 100 is ON. Accordingly, the ON resistance when the SJ MOSFET device 100 is ON can be improved. In this way, a switching characteristic equivalent to that of the conventional technology can be realized for the SJ MOSFET device 100 by including the separation trench 44, even when the front surface region 18 is included.

Figure 11:
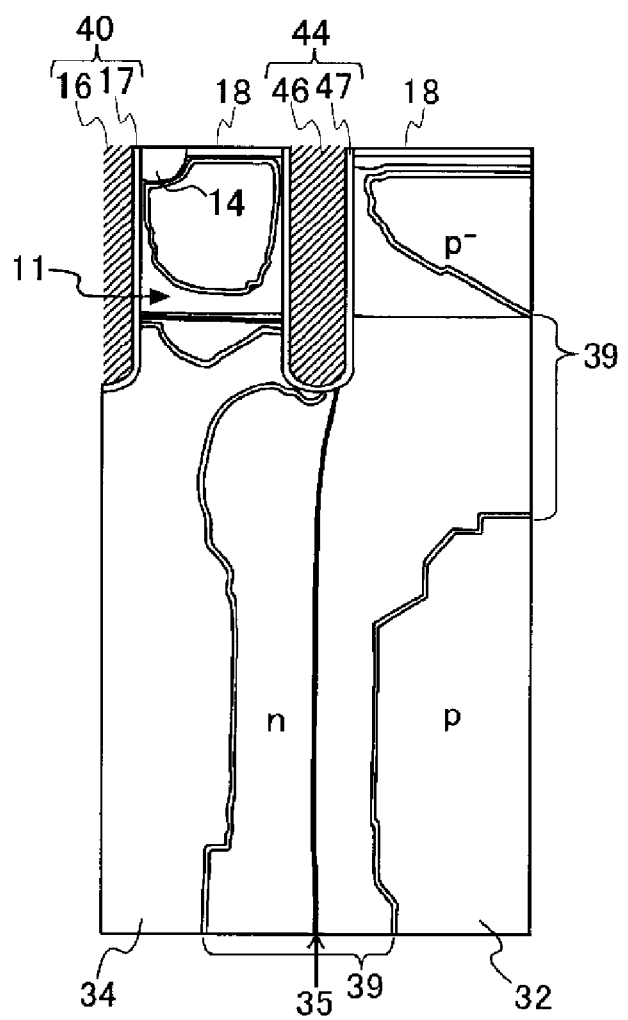
FIG. 11 shows the depletion layer 39 in a case where the separation trench 44 is present.

FIG. 11 shows the depletion layer 39 in a case where the separation trench 44 is present. The separation trench 44 may be provided closer to the gate trench 40 as long as the separation trench 44 can separate the channel region 11 and the p-type column 32 from each other. It should be noted that the breakdown voltage BV decreases when the separation trench 44 and the source region 14 physically contact each other, and therefore the separation trench 44 does not contact the source region 14. As made clear from a comparison between the configuration of FIG. 11 and the configuration shown in portion (b) of FIG. 7, the separation trench 44 restricts the depletion layer 39 from spreading to the channel region 11, which is the region adjacent to the gate insulating film 17 and directly below the source region 14.

Figure 12A:
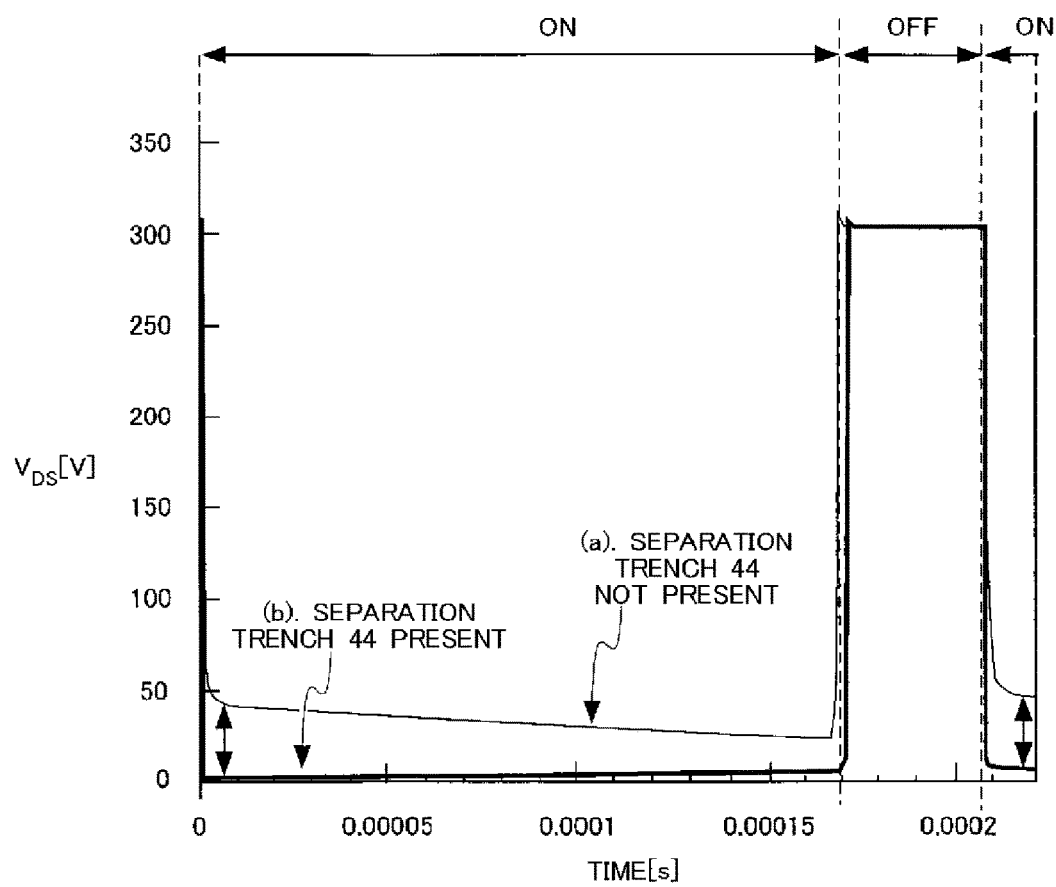
FIG. 12A shows the switching characteristic of the source-drain voltage $V_{DS}$.

FIG. 12A shows the switching characteristic of the source-drain voltage $V_{DS}$. The horizontal axis and vertical axis are the same as in FIG. 8A. In FIG. 12A, a condition is set for the potential applied to the gate electrode 16, the source electrode 24, and the drain electrode 60 in portions (a) and (b). The thin lines indicate the switching characteristic in a case where the separation trench 44 is not present, as shown in portion (a). The thick lines indicate the switching characteristic in a case where the separation trench 44 is present, as shown in portion (b). As made clear from this simulation, $V_{DS}$ [V] occurring when the SJ MOSFET device 100 is ON is lower when the separation trench 44 is present, as shown in portion (a), than when the separation trench 44 is not present, as shown in portion (b) (see the arrows in the drawing). In other words, the potential of the source electrode 24 when the SJ MOSFET device 100 is ON can be made lower in the case shown in portion (b) than in the case shown in portion (a). This is because, in the case shown in portion (b), the depletion layer 39 when the SJ MOSFET device 100 is ON can be prevented from reaching the channel region 11 (inversion layer).

Figure 12B:
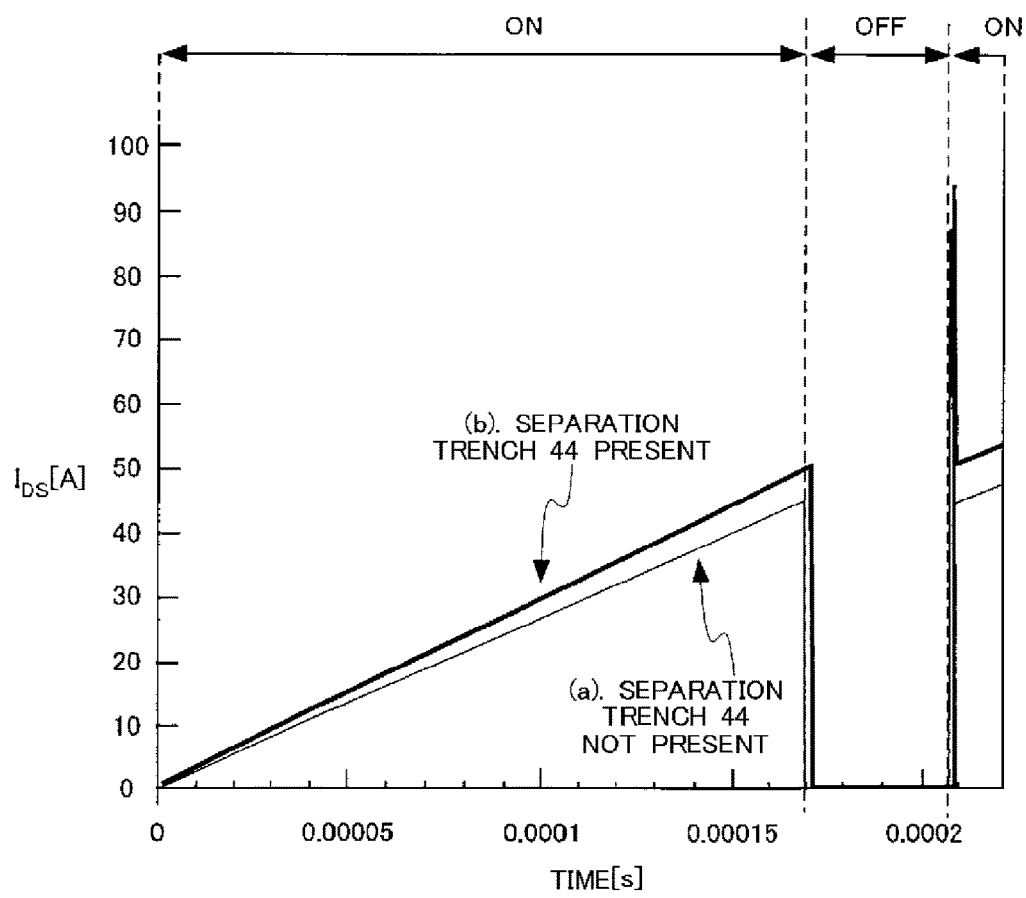
FIG. 12B shows the switching characteristic of the source-drain current $I_{DS}$.

FIG. 12B shows the switching characteristic of the source-drain current $I_{DS}$. The horizontal axis and vertical axis are the same as in FIG. 8B. The conditions concerning the ON and OFF timings and the potential applied to each electrode are the same as in FIG. 12A. As made clear from this simulation, $I_{DS}$ [A] when the SJ MOSFET device 100 is ON is higher in the case where the separation trench 44 is present, as shown in portion (b), than in the case where the separation trench 44 is not present, as shown in portion (a). This is because, in the case shown in portion (b), the depletion layer 39 when the SJ MOSFET device 100 is ON can be prevented from reaching the channel region 11 (inversion layer).

Figure 13:
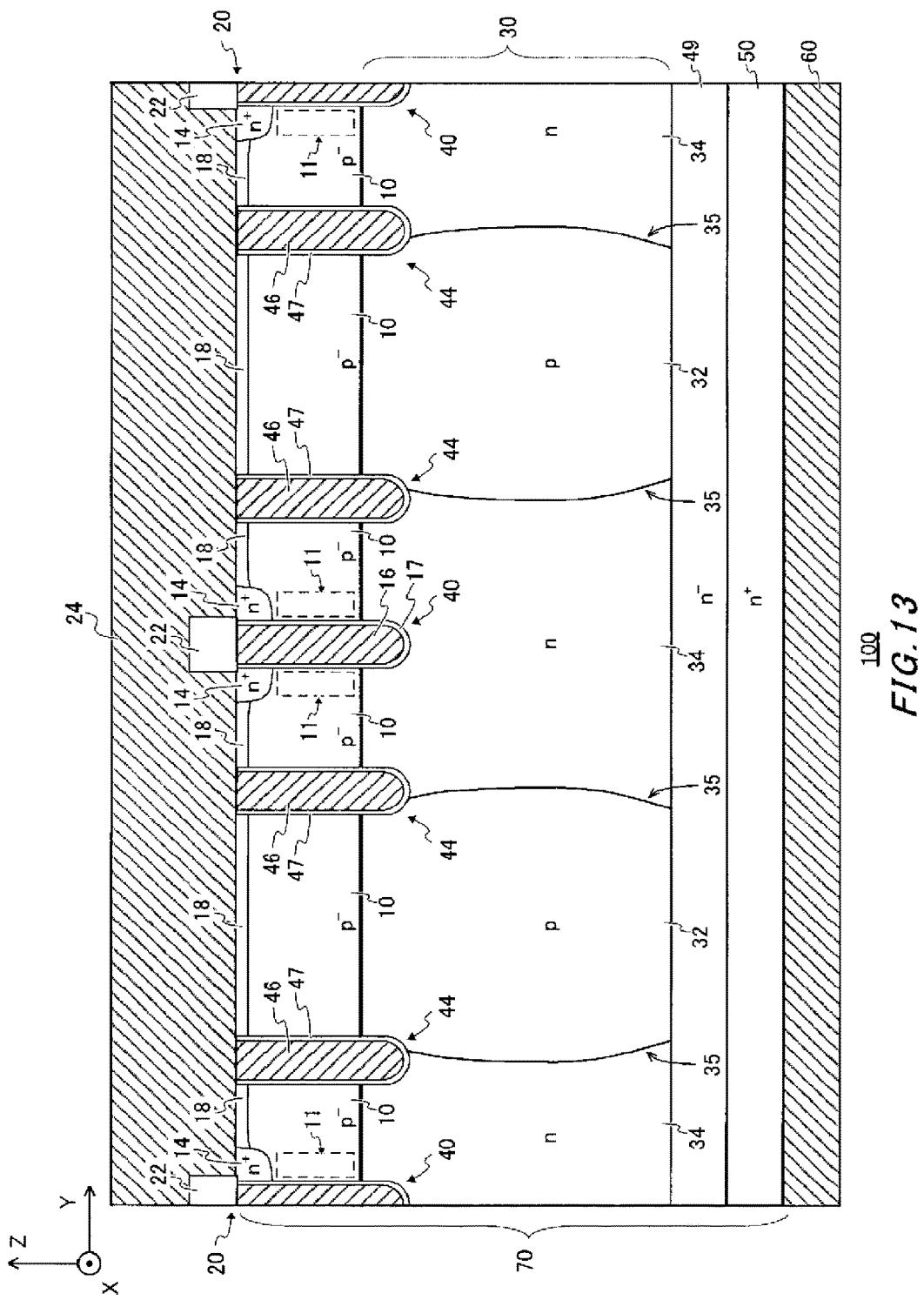
FIG. 13 shows a modification of the third embodiment.

FIG. 13 shows a modification of the third embodiment. The interlayer insulating film 22 is not provided on the separation trench 44 of this example. As a result, the trench electrode 46 of this example is electrically connected to the source electrode 24. This modification differs from the third embodiment with regard to this point. All other points of this modification are the same as in the third embodiment.

Figure 14A:
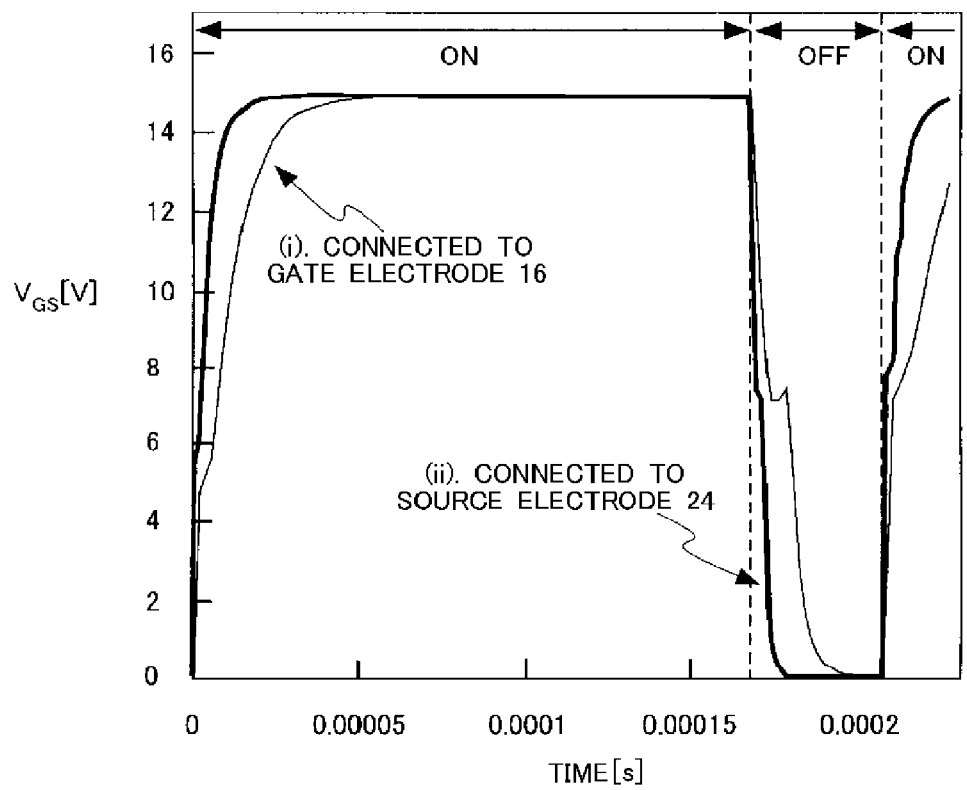
FIG. 14A shows the switching characteristic of the source-gate voltage $V_{GS}$ in a case where the trench electrode 46 is electrically connected to the gate electrode 16 or the source electrode 24.

FIG. 14A shows the switching characteristic of the source-gate voltage $V_{GS}$ in a case where the trench electrode 46 is electrically connected to the gate electrode 16 or the source electrode 24. The horizontal axis indicates time [s]. The vertical axis is the potential difference $V_{GS}$ of the gate (G) relative to the source (S). The ON and OFF timings are the same as in FIGS. 8A, 8B, 12A, and 12B. The same potential is applied to the gate electrode 16, the source electrode 24, and the drain electrode 60 in cases (i) and (ii). The thin line indicates the switching characteristic in case (i) where the trench electrode 46 is electrically connected to the gate electrode 16. The thick line indicates the switching characteristic in case (ii) where the trench electrode 46 is electrically connected to the source electrode 24. As made clear from this simulation, the capacitance is lower and the response characteristic is better in case (ii) where the trench electrode 46 is electrically connected to the source electrode 24 than in case (i) where the trench electrode 46 is electrically connected to the gate electrode 16.

Figure 14B:
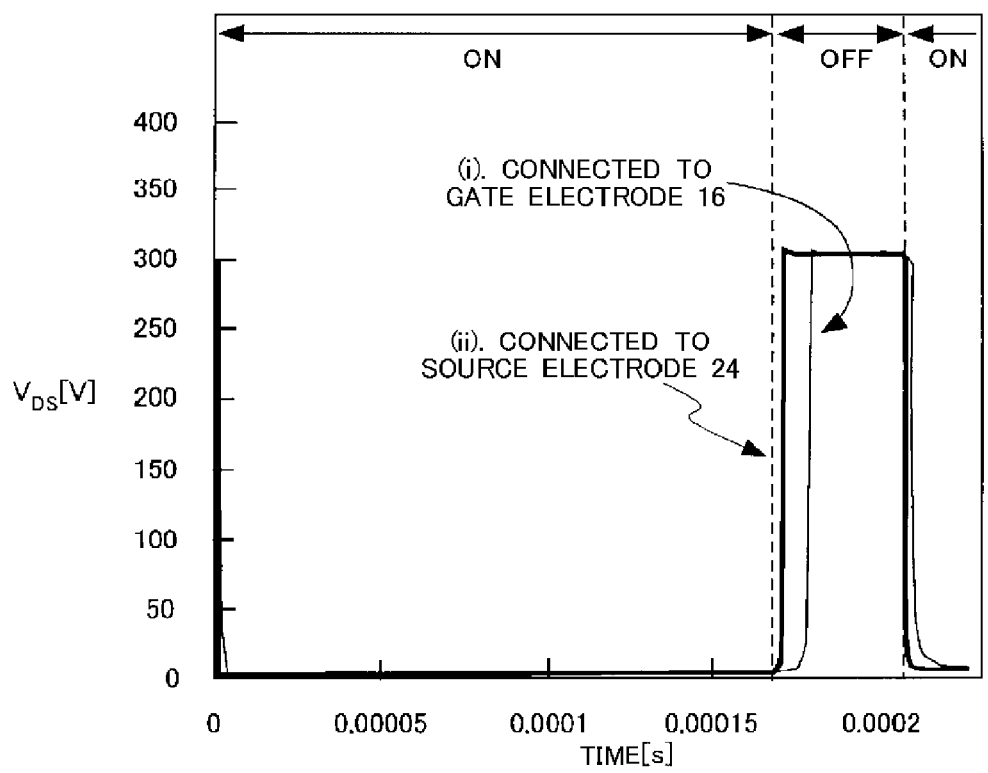
FIG. 14B shows the switching characteristic of the source-drain voltage $V_{DS}$ in a case where the trench electrode 46 is electrically connected to the gate electrode 16 or the source electrode 24.

FIG. 14B shows the switching characteristic of the source-drain voltage $V_{DS}$ in a case where the trench electrode 46 is electrically connected to the gate electrode 16 or the source electrode 24. The horizontal axis indicates time [s]. The vertical axis is the potential difference $V_{DS}$ of the drain (D) relative to the source (S). The ON and OFF timings and conditions relating to the potential applied to each electrode are the same as in FIG. 14A. As made clear from this simulation, the capacitance is lower and the response characteristic is better in case (ii) where the trench electrode 46 is electrically connected to the source electrode 24 than in case (i) where the trench electrode 46 is electrically connected to the gate electrode 16.

The difference in the response characteristic is believed to depend on the difference in capacitance of the floating region. In the third embodiment and the modification thereof, the floating region is the region that is sandwiched on the right and left by the gate trench 40 and the separation trench 44 and on the top and bottom by the source region 14 and front surface region 18 and the n-type column 34. In case (i), the capacitance Cf1 of the floating region can be expressed as shown in Expression 1, and in case (ii), the capacitance Cf2 of the floating region can be expressed as shown in Expression 2.

$$Cf1=Cgd+\{Cgf\cdot Cdf/(Cgf+Cdf)\} \qquad \text{Expression 1}$$

$$Cf2=Cgd+\{Cgf\cdot Cdf/(Cgs+Cgf+Cdf)\} \qquad \text{Expression 2}$$

Here, Cgd is the capacitance between the gate electrode 16 and the drain electrode 60. Cgf is the capacitance between the gate electrode 16 and the floating region. Cdf is the capacitance between the drain electrode 60 and the floating region. Cgs is the capacitance between the gate electrode 16 and the source electrode 24. As made clear from Expressions 1 and 2, Cf can be made lower by the value of Cgs in case (ii). Therefore, the capacitance delay can be made lower in case (ii) than in case (i). In other words, an effect of improving the response characteristic is realized.

Figure 15:
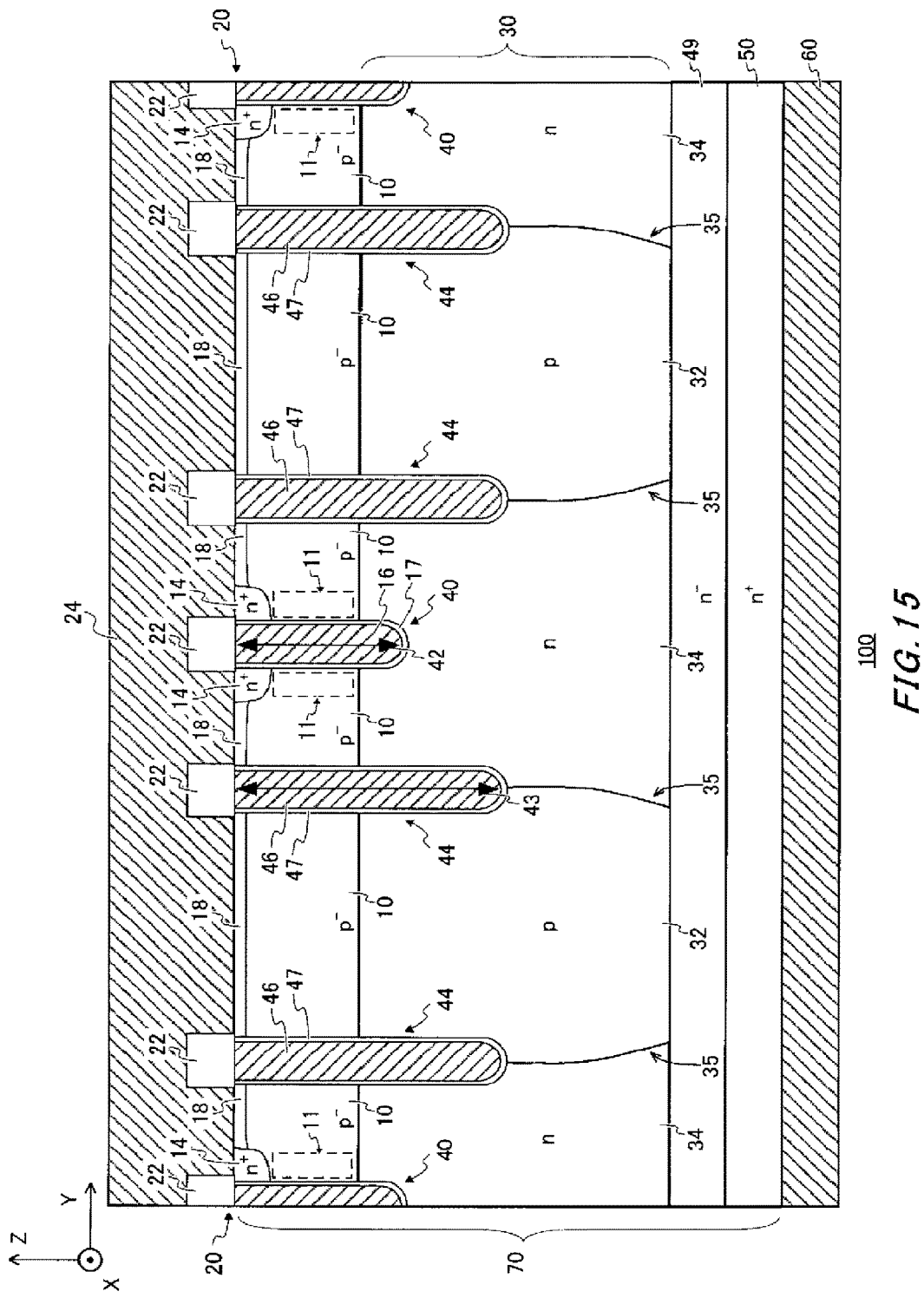
FIG. 15 shows a partial cross section of an SJ MOSFET device 100 according to a fourth embodiment.

FIG. 15 shows a partial cross section of an SJ MOSFET device 100 according to a fourth embodiment. The gate electrode 16 of this example is a trench gate electrode extending from the frontmost surface of the base region 10 and reaching the n-type column 34, in the same manner as in the third embodiment. However, the depth 43 of the separation trench 44 is greater than the depth 42 of the trench gate electrode. In other words, the depth of the trench electrode 46 is greater than the depth of the gate electrode 16. The fourth embodiment differs from the third embodiment with regard to this point. All other points of the fourth embodiment are the same as in the third embodiment. In this example, the p-type column 32 and the base region 10 directly above the p-type column 32 can be separated from the base region 10 directly above the n-type column 34 by the separation trench 44 more reliably, in terms of the design, than in the third embodiment.

Figure 16:
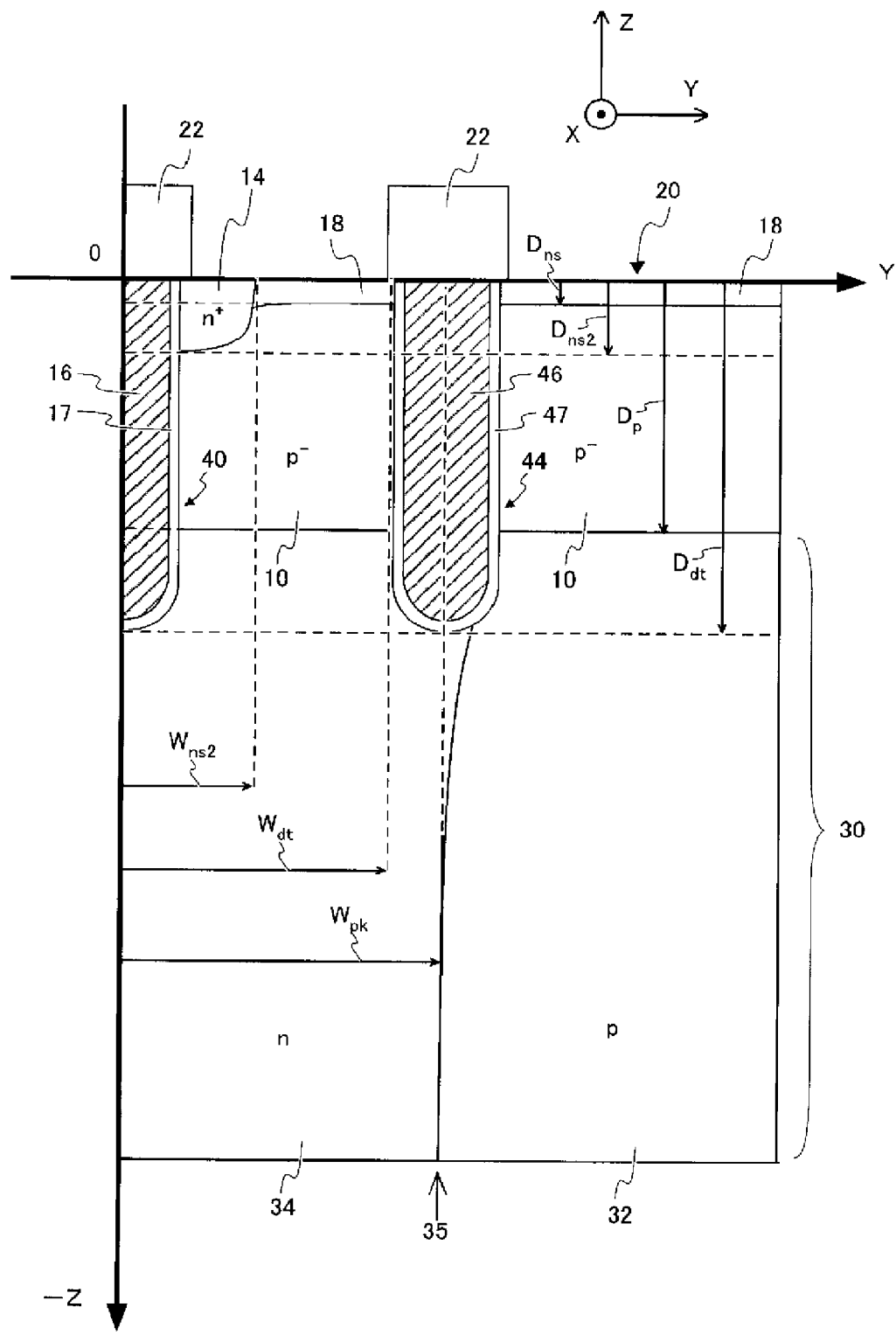
FIG. 16 is a drawing for describing the depth positions of the front surface region 18 and the separation trench 44 and the position of the separation trench 44 in the Y direction.

FIG. 16 is a drawing for describing the depth positions of the front surface region 18 and the separation trench 44 and the position of the separation trench 44 in the Y direction. The primary surface 20 matches the Y-direction axis. The depth of the front surface region 18 is $D_{ns}$ and the depth of the source region 14 is $D_{ns2}$. In this case, $D_{ns}$ and $D_{ns2}$ satisfy Expression 3. Furthermore, the depth of the base region 10 is $D_p$ and the depth of the gate trench 40 is $D_{dt}$. In this case, $D_p$ and $D_{dt}$ satisfy Expression 4.

$$D_{ns} \leq D_{ns2} \qquad \text{Expression 3}$$

$$D_p \leq D_{dt} \qquad \text{Expression 4}$$

The distance from the center of the gate electrode 16 to the end of the source region 14 in the +Y direction, which is a first direction, is $W_{ns2}$. The distance from the center of the gate electrode 16 to the end of the separation trench 44 in the −Y direction, which is opposite the first direction, is $W_{dt}$. The distance from the center of the gate electrode 16 to the boundary 35 is $W_{pk}$. In this case, $W_{ns2}$, $W_{dt}$, and $W_{pk}$ satisfy Expression 5.

$$W_{ns2} < W_{dt} \leq W_{pk} \qquad \text{Expression 5}$$

The center of the gate electrode 16 may be a central point along the length of the trench or planar gate electrode 16 in the Y direction. Expressions 3 and 4 may be applied to the first and second embodiments described above. Expressions 3 to 5 may be applied to the third embodiment, the fourth embodiment, and the modification of the third embodiment described above.

Figure 17A:
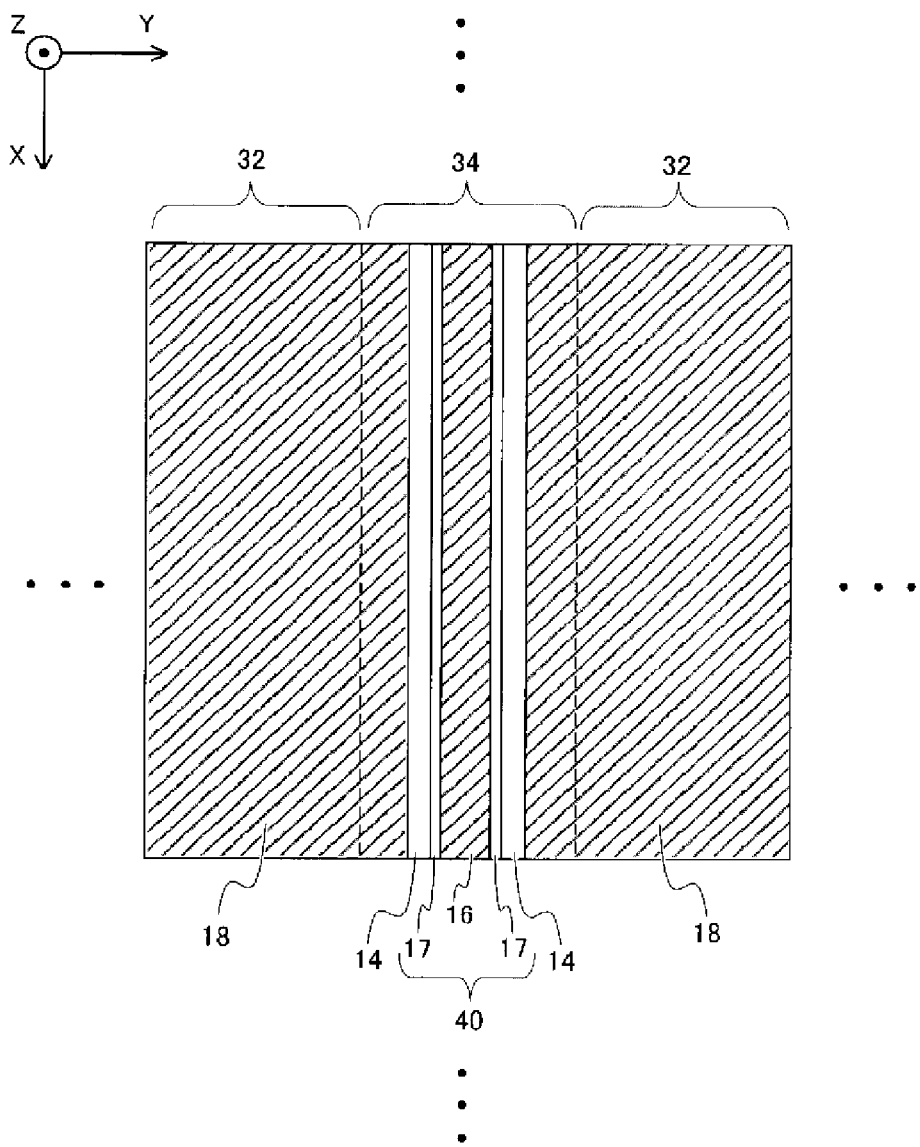
FIG. 17A shows the top surface of the SJ MOSFET device 100 according to the first embodiment.

FIG. 17A shows the top surface of the SJ MOSFET device 100 according to the first embodiment. In this example, the p-type column 32 and the n-type column 34 have striped shapes that are parallel in the X direction. The n-type column 34 is provided sandwiched between a pair of the p-type columns 32. This example corresponds to the top surface view of the first embodiment, and a gate trench 40 is provided in the n-type column 34. A top surface view corresponding to the second embodiment is not shown, but someone skilled in the art can understand such a view as being analogous to FIG. 17A. FIGS. 17A to 17F prioritize ease of viewing, and therefore omit the source electrode 24 and the interlayer insulating film 22.

Figure 17B:
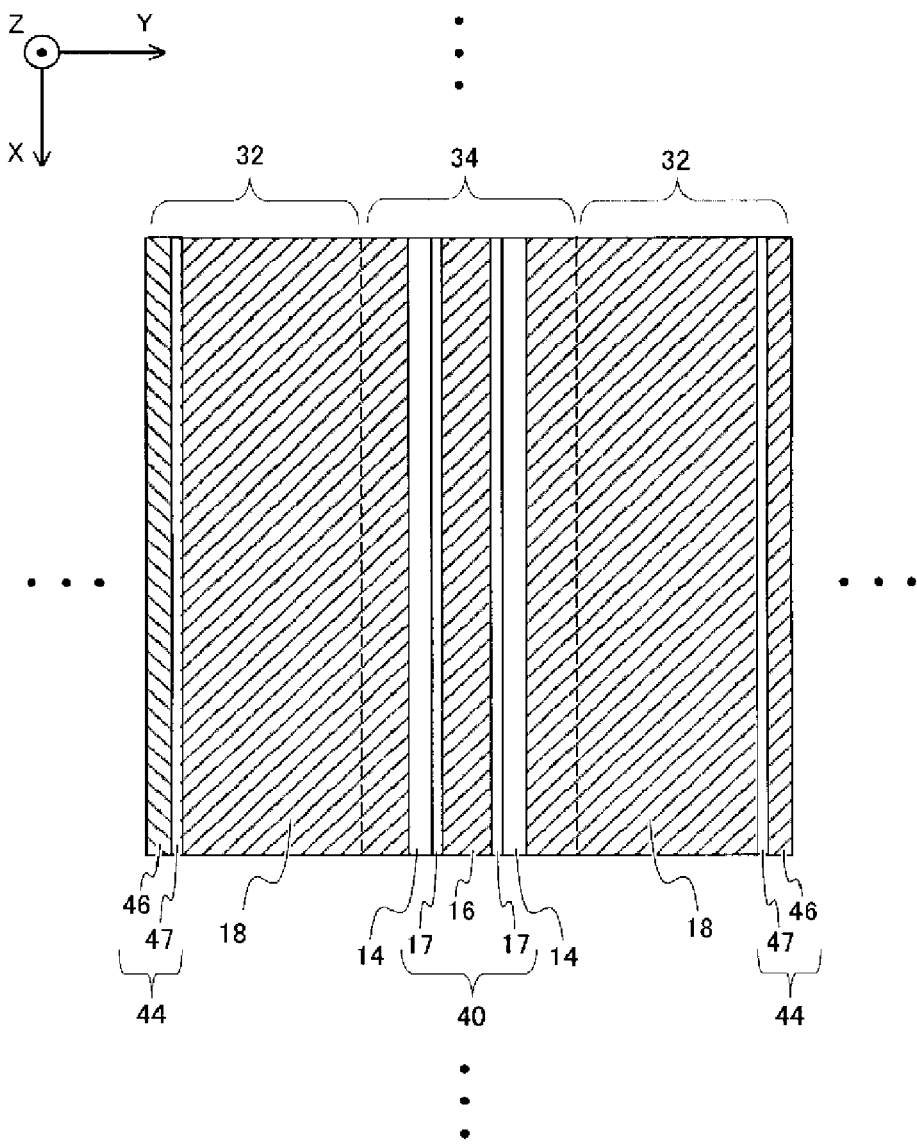
FIG. 17B shows the top surface of the SJ MOSFET device 100 according to the third embodiment, the fourth embodiment, and the modification of the third embodiment.

FIG. 17B shows the top surface of the SJ MOSFET device 100 according to the third embodiment, the fourth embodiment, and the modification of the third embodiment.

Figure 17C:
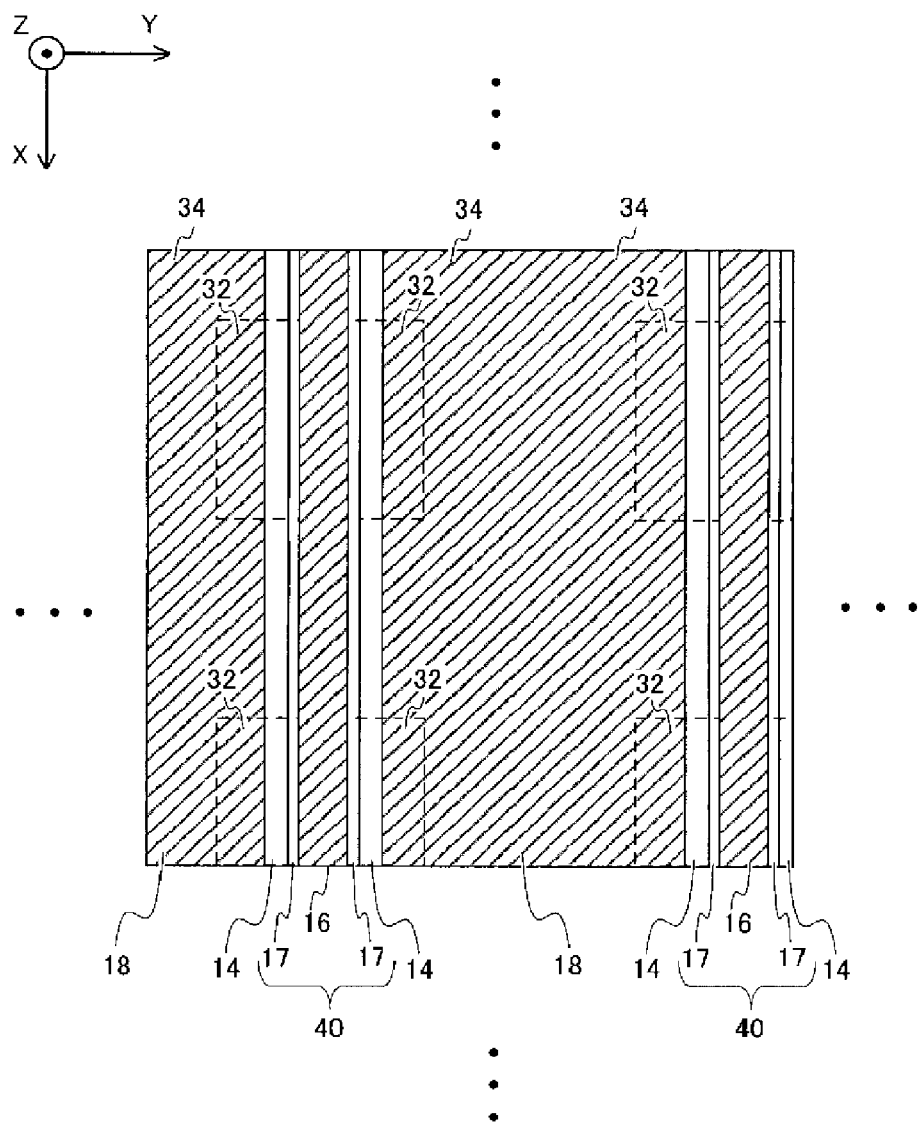
FIG. 17C shows a first modification of FIG. 17A.

FIG. 17C shows a first modification of FIG. 17A. In this example, the p-type column 32 has a rectangular shape as seen from above. A plurality of the rectangular p-type columns 32 are arranged in a grid as seen from above. The rectangular p-type columns 32 may be arranged periodically at uniform intervals in the X direction, and may be arranged periodically at uniform intervals in the Y direction. The rectangular shape may be a square or may be a rectangle. The region outside the rectangular p-type columns 32 corresponds to the n-type columns 34.

Figure 17D:
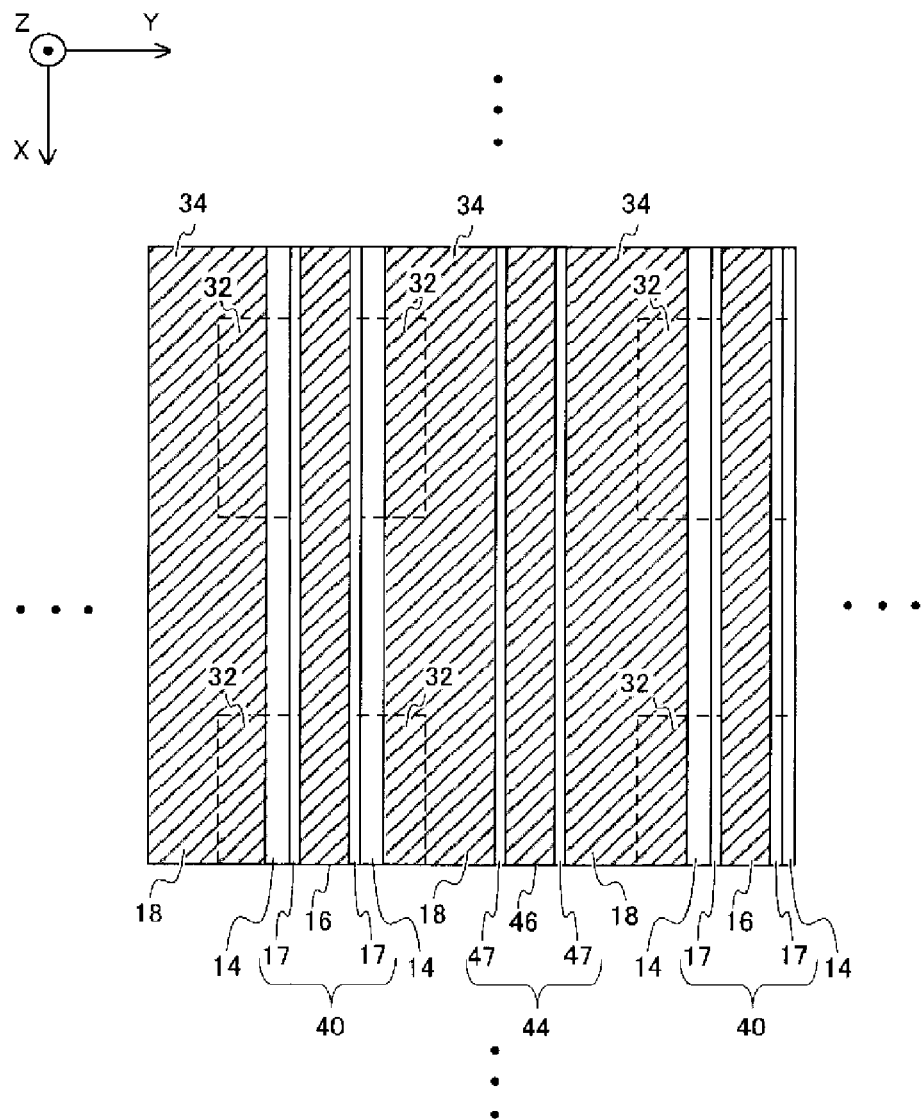
FIG. 17D shows a first modification of FIG. 17B.

FIG. 17D shows a first modification of FIG. 17B. In this example, a plurality of the separation trenches 44 are arranged parallel to the X direction in the n-type column 34 region.

Figure 17E:
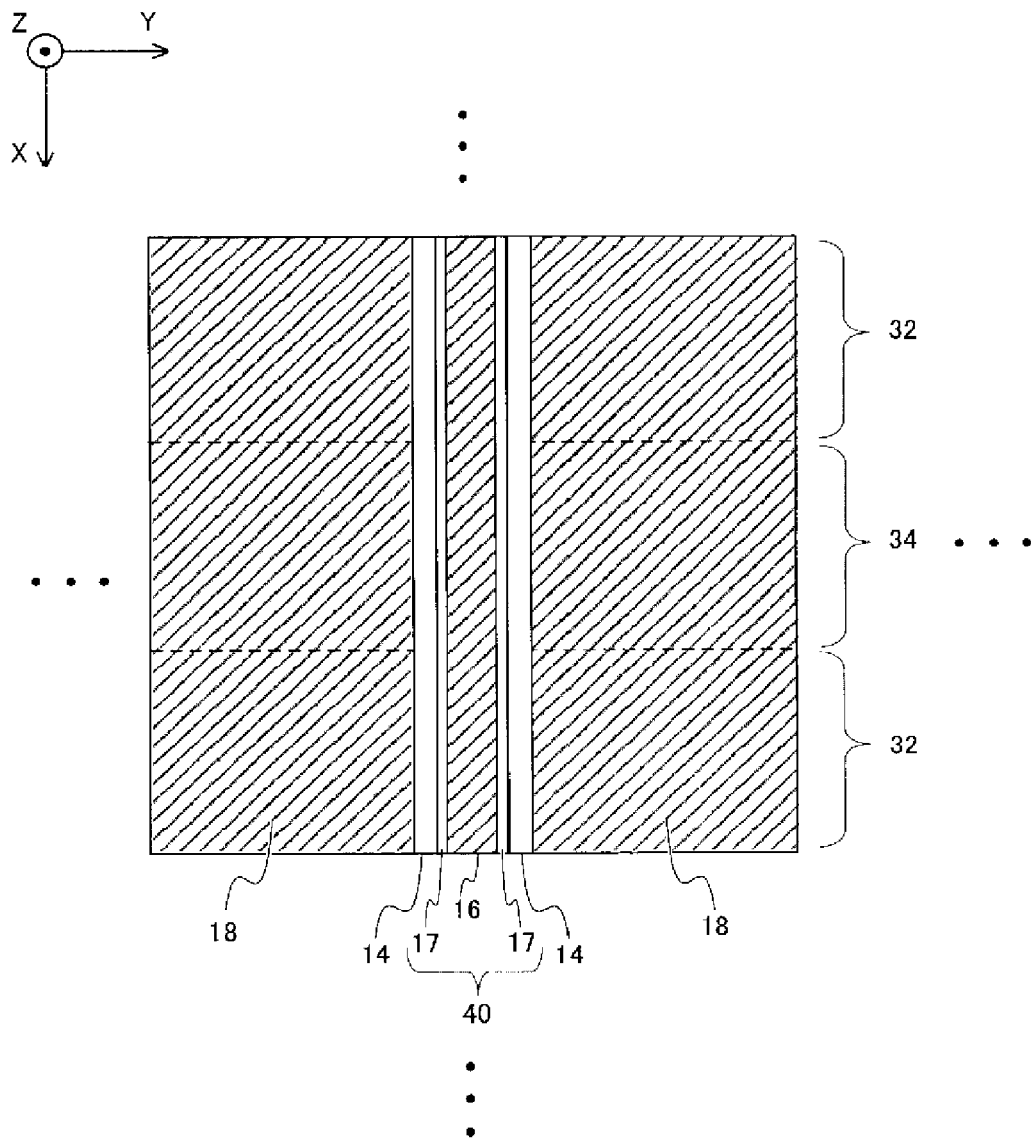
FIG. 17E shows a second modification of FIG. 17A.

FIG. 17E shows a second modification of FIG. 17A. In this example, the p-type columns 32 and the n-type columns 34 are formed as stripes parallel to the Y direction as seen from above, and the gate trenches 40 are formed as stripes parallel to the X direction as seen from above. The cross-sectional views in the first and second embodiments do not completely match the Y-Z plane or X-Z plane of this example. However, the technical idea of the first and second embodiments including the front surface region 18 may be applied to the arrangement of the p-type columns 32, the n-type columns 34, and the gate trenches 40 of this example.

Figure 17F:
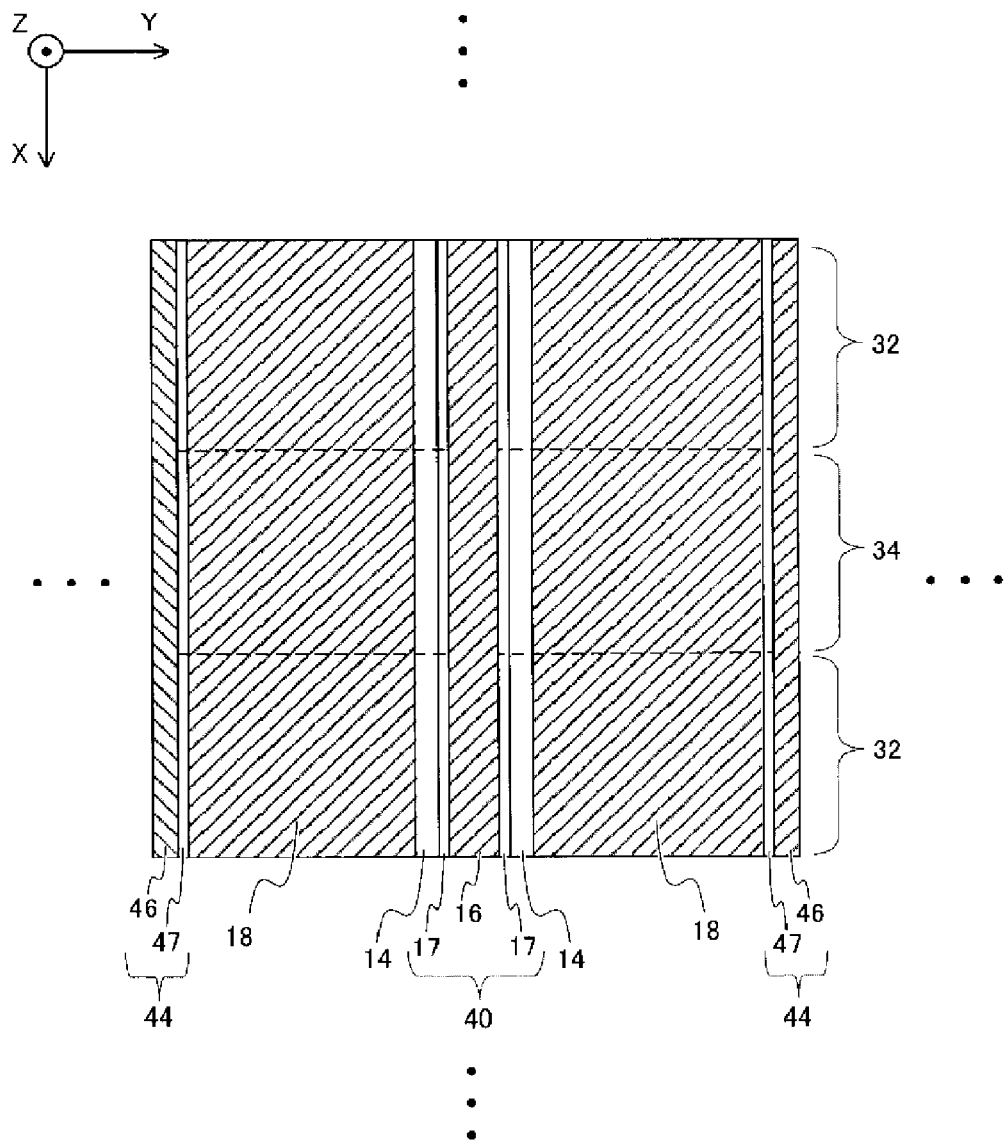
FIG. 17F shows a second modification of FIG. 17B.

FIG. 17F shows a second modification of FIG. 17B. In this example, the p-type columns 32 and the n-type columns 34 are formed as stripes parallel to the Y direction as seen from above, and the gate trenches 40 are formed as stripes parallel to the X direction as seen from above. The cross-sectional views in the third embodiment, fourth embodiment, and modification of the third embodiment do not completely match the Y-Z plane or X-Z plane of this example. However, the technical idea of the third embodiment, fourth embodiment, and modification of the third embodiment including the front surface region 18 and the separation trench 44 may be applied to the arrangement of the p-type columns 32, the n-type columns 34, and the gate trenches 40 of this example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

List of Reference Numerals

10: base region, 11: channel region, 13: thickness, 14: source region, 16: gate electrode, 17: gate insulating film, 18: front surface region, 19: thickness, 20: primary surface, 22: interlayer insulating film, 24: source electrode, 30: SJ region, 32: p-type column, 35: n-type column, 35: boundary, 38: protruding portion, 39: depletion layer, 40: gate trench, 42: depth, 43: depth, 44: separation trench, 46: trench electrode, 47: trench insulating film, 49: buffer region, 50: drain region, 60: drain electrode, 70: semiconductor substrate, 72: front surface region diode, 73: first body diode, 74: second body diode, 76: composite body diode, 94: contact region, 100: SJ MOSFET device, 120: IGBT device, 130: FWD, 200: semiconductor chip, 300: inverter apparatus

What is claimed is:

1. A super junction MOSFET device comprising:
   a semiconductor substrate;
   a base region that is provided on a primary surface side of the semiconductor substrate and has impurities of a first conductivity type;
   a source region that includes a portion of a frontmost surface of the base region and has impurities of a second conductivity type;
   a gate electrode that penetrates through the base region;
   a source electrode that is provided on the base region and is electrically connected to the source region; and
   a front surface region that is provided on an entirety of the frontmost surface of the base region in a region differing from a region where the source region and the gate electrode are provided in the base region, is electrically connected to the source electrode provided on the base region, and has a lower impurity concentration of impurities of the second conductivity type than the source region,
   wherein a depth of the front surface region forming a diode with the base region, from a primary surface side of the semiconductor substrate to a bottommost location of the front surface region, is $D_{ns}$ and a depth of an adjacent source region, from the primary surface side of the semiconductor substrate to a bottommost location of the source region, is $D_{ns2}$, wherein $D_{ns} \leq D_{ns2}$.

2. The super junction MOSFET device according to claim 1, wherein
   a ratio of the impurity concentration of impurities of the second conductivity type of the front surface region to an impurity concentration of impurities of the first conductivity type of the base region is greater than or equal to 1 and less than or equal to 1,000.

3. A semiconductor chip comprising:
   the super junction MOSFET device according to claim 1; and
   a free wheeling diode connected in parallel with the super junction MOSFET device.

4. A super junction MOSFET device comprising:
   a semiconductor substrate;
   a base region that is provided on a primary surface side of the semiconductor substrate and has impurities of a first conductivity type;
   a source region that includes a portion of a frontmost surface of the base region and has impurities of a second conductivity type;
   a gate electrode that penetrates through the base region;

a source electrode that is provided on the base region and is electrically connected to the source region; and a front surface region that is provided on an entirety of the frontmost surface of the base region in a region differing from a region where the source region and the gate electrode are provided in the base region, is electrically connected to the source electrode provided on the base region, and has a lower impurity concentration of impurities of the second conductivity type than the source region, wherein the semiconductor substrate includes first columns having impurities of the first conductivity type and second columns having impurities of the second conductivity type arranged periodically and in an alternating manner below the base region, the gate electrode extends from the frontmost surface of the base region and reaches the second columns, and the super junction MOSFET device further comprises separation trenches that each extend downward from a portion of the front surface region to a boundary between a second column and a first column adjacent to the second column and spatially separate the base region near the gate electrode from the first column.

5. The super junction MOSFET device according to claim 4, wherein an upper portion of each second column has a protruding portion that protrudes toward the first column side at the boundary between the first column and the second column, and a portion of each separation trench is positioned at a protruding portion.

6. The super junction MOSFET device according to claim 4, wherein the gate electrode is a trench gate electrode that extends from the frontmost surface of the base region and reaches the second column, and a depth of each separation trench is greater than a depth of the trench gate electrode.

7. The super junction MOSFET device according to claim 4, wherein each separation trench includes:

an insulating film; and a trench electrode that is provided in contact with the insulating film and is electrically connected to the gate electrode.

8. The super junction MOSFET device according to claim 4, wherein each separation trench includes:

an insulating film; and a trench electrode that is provided in contact with the insulating film and is electrically connected to the source electrode.

9. The super junction MOSFET device according to claim 4, wherein in a cross section obtained by cleaving the semiconductor substrate along a plane orthogonal to the primary surface, when a distance from a center of the gate electrode to an end of the source region in a first direction is $W_{ns2}$, a distance from the center of the gate electrode to an end of the separation trench in a direction opposite the first direction is $W_{dt}$, and a distance from the center of the gate electrode to the boundary between the first column and the second column is $W_{pk}$, the expression $W_{ns2} < W_{dt} \leq W_{pk}$ is satisfied.

* * * * *